(12) United States Patent
Yoshioka

(10) Patent No.: US 6,445,634 B2
(45) Date of Patent: Sep. 3, 2002

(54) SERIAL ACCESS MEMORY AND DATA WRITE/READ METHOD

(75) Inventor: Shigemi Yoshioka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/778,891

(22) Filed: Feb. 8, 2001

(30) Foreign Application Priority Data

Jun. 26, 2000 (JP) ........................................ 2000-190584

(51) Int. Cl.$^7$ ................................................ G11C 7/00
(52) U.S. Cl. ................................. 365/221; 365/189.01
(58) Field of Search ............................. 365/221, 189.01

(56) References Cited

U.S. PATENT DOCUMENTS

| | | | |
|---|---|---|---|
| 4,648,077 A | * 3/1987 | Pinkam et al. | 365/240 |
| 5,812,148 A | 9/1998 | Takasugi et al. | 345/515 |
| 5,978,303 A | 11/1999 | Takasugi et al. | 365/230.03 |
| 6,069,639 A | 5/2000 | Takasugi | 345/521 |
| 6,088,285 A | 7/2000 | Takasugi | 365/230.05 |

FOREIGN PATENT DOCUMENTS

JP         0089277    * 3/1990    ............ G11C/8/04

OTHER PUBLICATIONS

Betty Prince, "Semiconductor Memories", 1983, Wiley, 2$^{nd}$ pp. 149–151.*

* cited by examiner

Primary Examiner—M. Tran
(74) Attorney, Agent, or Firm—Volentine Francos, PLLC

(57) ABSTRACT

There is provided a serial access memory and a data write/read method applicable thereto. The serial access memory is able to function as the prior art FIFO type serial access memory and as the prior art line access type serial access memory, too. This serial access memory 101 is provided with a memory cell array 11, a write register group 17, a read register group 20, and a write/read register group 32. The write/read register group 32 is made up of write/read registers WRreg-1 to WRreg-m. These write/read registers are prepared by the same number as that of memory cells (m pieces) connected with each of word lines WL1 to WLn, in the same way as the write registers Wreg-1 to Wreg-m forming the write register group 17 and the read registers Rreg-1 to Rreg-m forming the read register group 20.

18 Claims, 14 Drawing Sheets

SERIAL ACCESS MEMORY AND DATA WRITE/READ METHOD

BACKGROUND OF THE INVENTION

1. Field of the Invention

The present invention relates to a serial access memory and a data write/read method applicable thereto.

2. Prior Art

In the digital processing of the video signal relating to a television (TV) and a video tape recorder (VTR), the video signal is converted into the digital data by means of an analog-to-digital (A/D) converter and is then spread out and stored in a predetermined video memory. If it is needed to execute such a inter-frame operation as represented by a three dimensional Y/C isolation, a frame memory capable of storing the data equivalent to one video frame is used as a video memory.

In general, the frame memory is provided with a serial access memory (SAM) which serves to serially input the data to and output the data from the frame memory. Prior art serial access memories are classified into two types according to their way of accessing, that is, one being a line access type and the other a First In First Out (FIFO) type.

The FIFO type serial access memory does not need any address input from the outside. In the serial access memory of this type, the write operation and the read operation as well are equally commenced with the input of a reset signal. With start of the write operation, the video data is continuously written in sequence in all the memory cells, starting from the memory cell of the leading address. Also, with start of the read operation, the storage data of the memory cells are continuously read out in sequence from all the memory cells, starting from the memory sell of the leading address.

In case of the line access type serial access memory, on one had, in starting the write/read operation, one word line is selected from among a plurality of word lines according to the address as inputted externally, and the access is made to a plurality of memory cells connected with the selected word line. Like this, according to the line access type serial access memory, the line address can be set at random, so that the video data for a split edit display and a child display as well can by supplied to a display.

The FIFO type serial access memory and the line access type serial access memory are equally provided with a write register for temporarily storing the data to be written in the memory cell array, and a read register for temporarily storing the data read out from the memory cell array. Furthermore, the FIFO type serial access memory is provided with a write/read register besides the write register and the read register. This write/read register serves to store the data which includes in part the serial data inputted to the serial access memory, that is, includes by a predetermined number of bits counted from the leading bit.

In the serial access memory, when the data is transferred from the write register to the memory cell array or from the memory cell array to the read register, one word line is specified and selected from among the plural word lines. In this case, however, a time of 200 to 300 ns has to be spent until the electric potential of the selected word line reaches a predetermined level. Moreover, in the serial access memory, since the read operation and the write operation are executed in a synchronism with each other, there might happen that the data transfer operation from the write register to the memory cell array in the write operation overlaps with the data transfer operation from the memory cell array to the read register in the read operation. In addition to this, there might happen that the self-refresh operation might overlap with the above two operations.

Therefore, in order to start the substantial data write operation to the memory cell array or the substantial data read operation from the memory cell array after inputting the address externally, it required to allow a predetermined time (i.e. wait time: about 1.5 fÊs) to pass away.

In this respect, the FIFO type serial access memory is provided with the write/read register as described above, so that the access to this write/read register is carried out while the electric potential of the selected word line reaches the predetermined level. Accordingly, different from the line access type serial access memory, the substantial write/read operation may be commenced immediately after the reset signal is inputted.

As described above, two types of the prior art serial access memory are available and they are characterized by their own functions, respectively. Thus, either the line access type or the FIFO type is selected so as to meet the specification of a given system into which the serial access memory is to be incorporated.

However, even through one of the serial access memories of the above two types is selected, it might happen that the function of the other type becomes necessary. For instance, the FIFO type serial access memory is unable to designate the address at random. Accordingly, a special method is required when executing the image processing such as the line interpolation by means of the serial access memory of this type. To put it concretely, while the word line is selected in sequence starting from the word line of the leading address, it is needed to prevent any storage data of the memory cell array from being read out therefrom by keeping the read enable signal in the inactive state until the word line of a predetermined address is selected.

The invention has been made in view of the problems as mentioned above and its object is to provide a serial access memory having both functions of the prior art line access memory of the line access type and the prior art line access memory of FIFO type as well, and capable of properly choosing and executing a suitable data write/read operation in a given system, and further, to provide a data write/read method applicable to such a serial access memory.

SUMMARY OF THE INVENTION

In order to solve the problems as described above, according to the first aspect of the invention, there is provided a serial access memory which is characterized by including a plurality of memory cells which are arranged at each of intersections made by a plurality of word lines and a plurality of bit lines; the first register having a capacity capable of storing a data of one word to be stored in the plural memory cells connected with each of the plural word lines, and after storing an input serial data of one word, transferring the stored one word data to plural memory cells connected with one word line selected from among the plural word lines; the second register having a capacity capable of storing one word data to be stored in the plural memory cells connected with each of the plural word lines, receiving the storage data of one word transferred from the plural memory cells connected with one word line selected from among the plural word lines, and outputting the transferred one word data as an output serial data of one word; and the third register having a capacity capable of storing one word data to be stored in the plural memory cells connected with each of the plural word lines, and after storing an input serial data of one word, outputting it as an output serial data of one word. According to the structure of the serial access memory as described above, it becomes possible to store, in the third register, the same data as that which is stored in the first register and transferred to the plural memory cells connected with the selected word line. Therefore, in case of reading out the data stored in the plural memory cells connected with the selected word line, it becomes possible to read out the data stored in the third register instead of the data stored in the memory cells.

The serial access memory may include a common address selector capable of outputting an address signal to the second and third registers, respectively. With this structure, it becomes possible for the second and third registers to serially output their storage data, respectively, according to the address signal outputted from the common address selector. With this, the electronic circuit scale of the serial access memory is made smaller as compared with the case where the second and third registers are separately provided with an address selector.

The serial access memory according to the invention may be provided with a data transfer block which transfers the storage data of the first register to the third register. This structure makes it possible to transfer the storage data of the first register to the third register all at once. Accordingly, the time required for storing the data is reduced as compared with the case that the serial data is separately stored in the third register.

According to the second aspect of the invention, there is provided a data write/read method of a serial access memory including a plurality of memory cells which are arranged at each of intersections made by a plurality of word lines and a plurality of bit lines, the first register having a capacity capable of storing a data of one word to be stored in the plural memory cells connected with each of the plural word lines, the second register having a capacity capable of storing a data of one word to be stored in the plural memory cells connected with each of the plural word lines, and the third register having a capacity capable of storing a data of one word to be stored in the plural memory cells connected with each of the plural word lines. This data write/read method of a serial access memory is characterized by including the first write step of storing an input serial data of one word in the first register and the third register as well; the second write step of transferring the one word data stored in the first register according to the first write step, to the plural memory cells connected with one word line selected from among the plural word lines; the third write step of storing, in the first register, an input serial data of one word next to the input serial data of one word stored in the first register and the third register as well according to the first write step; and the fourth write step of transferring the one word data stored in the first register according to the third write step, to the plural memory cells connected with the other word line selected from among the plural word lines. According to this method, the same data as the storage data of the third register comes to be stored in the plural memory cells connected with the one word line, to which the data is transferred from the first register according to the second write step.

According to the third aspect of the invention, there is provided a data write/read method applicable to the above-mentioned serial access memory. This data write/read method is characterized by including the first write step of storing an input serial data of one word in the first register; the second write step of transferring the one word data stored in the first register according to the first write step, to the plural memory cells connected with one word line selected from among the plural word lines as well as to the third register; the third write step of storing in the first register an input serial data of one word next to the input serial data of one word stored in the first register according to the first write step; and the fourth write step of transferring the one word data stored in the first register according to the third write step, to the plural memory cells connected with the other word line selected from among the plural word lines. According to this method, the same data as the storage data of the third register comes to be stored in the plural memory cells connected with the one word line, to which the data is transferred from the first register according to the second write step. Moreover, it becomes possible to transfer the storage data of the first register to the third register all at once. Accordingly, the time required for and the electric power consumed in writing the data is reduced as compared with the case where the serial data of one word is separately stored in the third register.

According to the fourth aspect of the invention, there is provided a data write/read method applicable to the above-mentioned serial access memory. This data write/read method is characterized by including the first write step of storing an input serial data of one word in the first register; the second write step of transferring the one word data stored in the first register according to the first write step, to the third register; the third write step of storing in the first register an input serial data of one word next to the input serial data of one word stored in the first register according to the first write step; the fourth write step of transferring the one word data stored in the first register according to the third write step, to the plural memory cells connected with one word line selected from among the plural word lines; the fifth write step of storing in the first register an input serial data of one word next to the input serial data of one word stored in the first register according to the third write step; and the sixth write step of transferring the one word data stored in the first register according to the fifth write step to the plural memory cells connected with the other word line selected from among the plural word lines. According to this method, since no overlap storage by the storage data of the third register is caused in the plural memory cells connected with each word line, efficiency of the write operation is improved.

Furthermore, the data write/read method of the serial access memory according to the invention is characterized by including the first read step of transferring a storage data of one word from the plural memory cells connected with the one word line to the second register; the second read step of outputting the storage data of one word transferred to and stored in the second register according to the first step as an output serial data of one word; the third read step of transferring a storage data of one word from the plural memory cells connected with a word line other than the one word line to the second register; and the fourth read step of outputting the data transferred to and stored in the second register according to the third read step as an output serial data of one word. Still further, the method may additionally include the first read step of outputting the data stored in the third register as an output serial data of one word; the second read step of transferring a storage data of one word to the second register from the plural memory cells connected with a word line other than the one word line; and the third read step of outputting the data transferred from and stored in the second register according to the second read step as an output serial data of one word.

The data write/read method of the serial access memory according to the invention is characterized by including the first read step of outputting the data stored in the third register as an output serial data of one word; the second read step of transferring a storage data of one word from the plural memory cells connected with the one word line to the second register; the third read step of outputting the data transferred to and stored in the second register according to the second read step as an output serial data of one word; the fourth read step of transferring the storage data of one word from the plural memory cells connected with a word line other than the one word line to the second register; and the fifth read step of outputting the data transferred to and stored in the second register according to the fourth step as an output serial data of one word.

The second read step may be executed in parallel with the first read step, thereby making it possible to reduce the time required for the data read.

According to the fifth aspect of the invention, there is provided a data write/read method applicable to a serial access memory which includes a plurality of memory cells which are arranged at each of intersections made by a plurality of word lines and a plurality of bit lines, the first register having a capacity capable of storing a data of one word (m bits) to be stored in the plural memory cells connected with each of the plural word lines, the second register having a capacity capable of storing a data of one word (m bits) to be stored in the plural memory cells connected with each of the plural word lines, and the third register having a capacity (p bits) smaller than the capacity capable of storing a data of one word (m bits) to be stored in the plural memory cells connected with each of the plural word lines. This data write/read method is characterized by including the first write step of storing the first bit through the pth bit of an input serial data of one word in the third register; the second write step of storing the (p+1)th bit through the mth bit of the input serial data of one word in the first register; the third write step of transferring the (p+1)th bit through the mth bit of the data stored in the first register according to the second write step, to the plural memory cells connected with one word line selected from among the plural word lines; the fourth write step of storing, in the first register, an input serial data of one word next to the input serial data of one word stored in the third register as well as in the first register according to the second write step; and the fifth write step of transferring the one word data stored in the first register according to the fourth write step, to the plural memory cells connected with a word line other than the one word line.

According to the invention, a data write/read method of the serial access memory includes the first read step of transferring a storage data of one word from the plural memory cell connected with the one word line to the second register; the second read step of outputting the data stored in the third register as an output serial data of one word having a length of p bits; the third read step of outputting the (p+1)th bit through the mth bit among the data transferred to and stored in the second register according to the first read step, as an output serial data; the fourth read step of transferring a storage data of one word from the plural memory cells connected with a word line other than the one word, to the second register; and the fifth read step of outputting the data transferred to and stored in the second register according to the fourth read step, as a output serial data of one word.

Furthermore, according to the invention, a data write/read method of the serial access memory includes the first read step of outputting the data stored in the third register as an output serial data having a length of p bits; the second read step of transferring the storage data of the plural memory cells connected with the one word line to the second register in parallel with the first read step; the third read step of outputting the (p+1)th bit through the mth bit among the data ransferred to and stored in the second register according to the second read step, as an output serial data; the fourth read step of transferring the storage data of one word from the plural memory cells connected with a word line other than the one word line to the second register; and the fifth read step of outputting the data transferred to and stored in the second register according to the fourth read step as an output serial data of one word.

PREFERRED EMBODIMENTS OF THE INVENTION

A serial access memory and a data write/read method according to the invention will now be described in detail by way of several exemplary preferred embodiments of the invention with reference to the accompanying drawings as listed as follows. In the following description and accompanying drawings, like parts constituting the invention are denoted with like reference numerals and symbols in order to avoid the repetitive redundant description.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENT

First Embodiment

Figure 1:
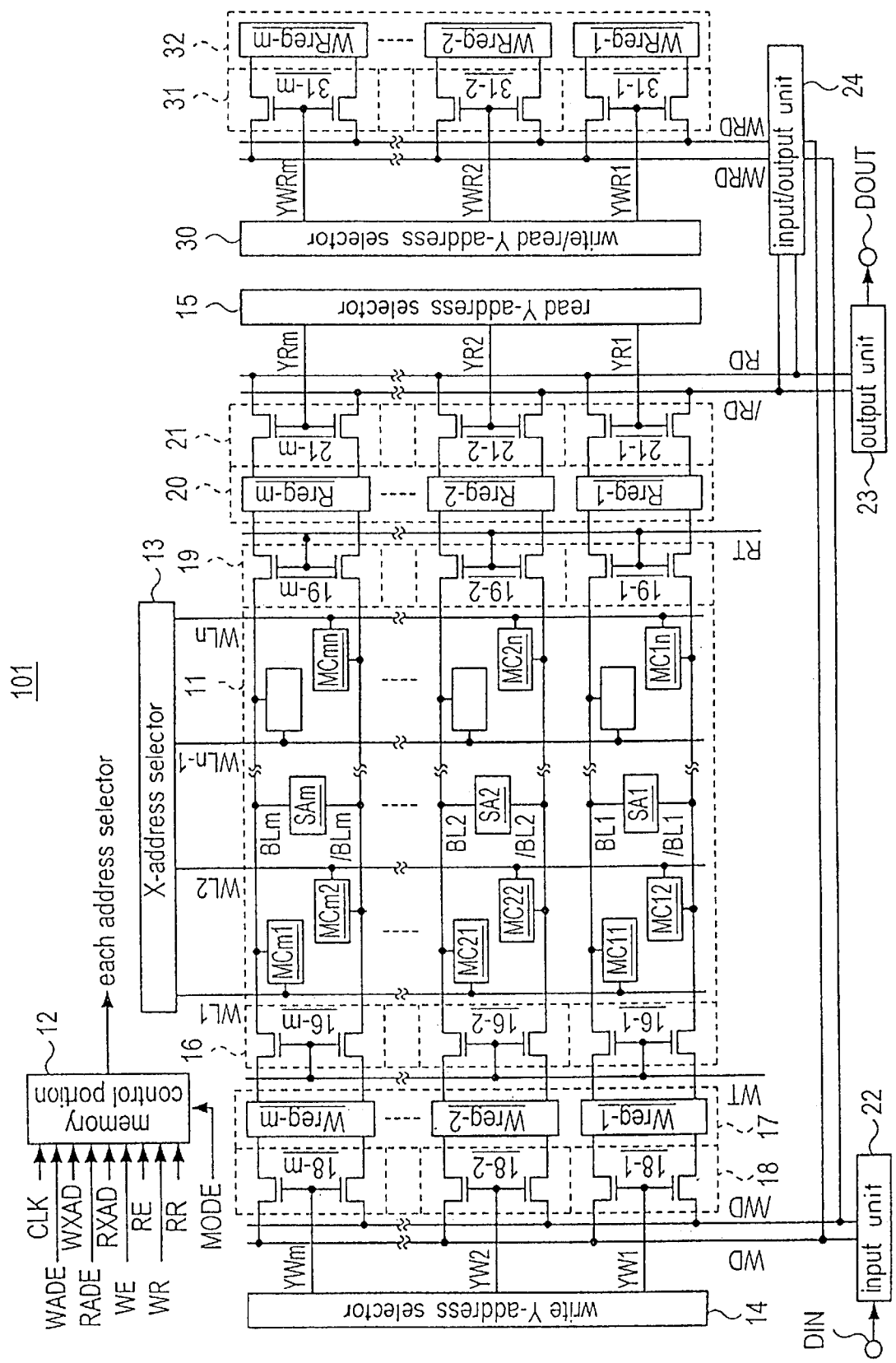
FIG. 1 is a circuit diagram for showing the structure of a serial access memory according to the first embodiment of the invention.

FIG. 1 is a diagrammatic view showing the structure of a serial access memory 101 according to the first embodiment of the invention.

The serial access memory 101 is provided with a memory cell array 11, a memory control portion 12, an X-address selector 13, a write Y-address selector 14, a read Y-address selector 15, a write side first transfer unit group 16, a write register group 17, a write side second transfer unit group 18, a read side first transfer unit group 19, a read register group 20, a read side second transfer unit group 21, an input unit 22, an output unit 23, an input/output unit 24, a write/read Y-address selector 30, a write/read transfer unit group 31, and a write/read register group 32.

The X-address selector 13 is controlled by means of the memory control portion 12 and selects one word line from among a plurality of word lines WL1 to WLn (n: positive integer) and puts the selected word line in the logical high-level state (referred to as "H-level" hereinafter).

The memory cell array 11 is made up of a plurality of memory cells MC11 to MCmn (m: positive integer), each of which is arranged at each of intersections made by a plurality of word lines WL1 to WLn and a plurality of bit line pairs BL1, /BL1 to BLm, /BLm. Each of the memory cells MC11 to MCmn is provided with one each of a transistor (not shown) and a capacitor (not shown).

The bit line pairs BL1, /BL1 to BLm, /BLm are connected with a plurality of sense amplifiers SA1 to SAm, by which a potential variation appearing on the bit line pairs BL1, /BL1 to BLm, /BLm is amplified.

Now, there will be described the structure and function of an electronic circuit arranged on the write side of the memory cell array 11.

The bit line pairs BL1, /BL1 to BLm, /BLm are connected with the write register group 17 through the write side first transfer unit group 16. The write side first transfer unit group 16 is composed of a plurality of write side first transfer units 16-1 to 16-m which correspond to the bit line pairs BL1, /BL1 to BLm, /BLm, respectively. The write register group 17 is composed of a plurality of write registers Wreg-1 to Wreg-m which correspond to the bit line pairs BL1, /BL1 to BLm, /BLm, respectively.

Each of the write side first transfer units 16-1 to 16-m is made up of two transistors. For instance, the bit line BL1 is connected with the write register Wreg-1 through the drain and source of one transistor forming the write side first transfer unit 16-1 while the bit line /BL1 is connected with the write register Wreg-1 through the drain and source of the other transistor forming the write side first transfer unit 16-1. The ON/OFF control of these 2×m transistors forming the write side first transfer units 16-1 to 16-m is carried out with a control signal WT.

The write register group 17 is connected with write data buses WD, /WD through the write side second transfer unit group 18. This write side second transfer unit group 18 is made up of a plurality of write side second transfer units 18-1 to 18-m corresponding to the write registers Wreg-1 to Wreg-m, respectively, which form the write register group 17.

Each of the write side second transfer units 18-1 to 18-m is composed of two transistors. For instance, the write register Wreg-1 is connected with write data buses WD, /WD through respective drains and sources of two transistors forming the write side second transfer unit 18-1. Each of the write side second transfer units 18-1 to 18-m is arranged so as to receive the write Y-address signals YW1 to YWm outputted from the write Y-address selector 14, and the ON/OFF control of two transistors forming each of the write side second transfer units 18-1 to 18-m is carried out with the write Y-address signals YW1 to Ywm.

The write data buses WD, /WD are connected with an input terminal DIN through an input unit 22.

In the next, there will be described the structure of an electronic circuit arranged on the read side of the memory cell array 11.

The bit line pairs BL1, /BL1 to BLm, /BLm are connected with the read register group 20 through the read side first transfer unit group 19. The read side first transfer unit group 19 is composed of a plurality of read side first transfer units 19-1 to 19-m which correspond to the bit line pairs BL1, /BL1 to BLm, /BLm, respectively. The read register group 20 is made up of a plurality of read registers Rreg-1 to Rreg-m which correspond to the bit line pairs BL1, /BL1 to BLm, /BLm, respectively.

Each of the read side first transfer units 19-1 to 19-m is made up of two transistors. For instance, the bit line BL1 is connected with the read register Rreg-1 through the drain and source of one transistor forming the read side first transfer unit 19-1 while the bit line /BL1 is connected with the read register Rreg-1 through the drain and source of the other transistor forming the read side first transfer unit 19-1. The ON/OFF control of 2×m transistors forming the read side first transfer units 19-1 to 19-m is carried out with a control signal RT.

The read register group 20 is connected with read data buses RD, /RD through the read side second transfer unit group 21. This read side second transfer unit group 21 is made up of a plurality of read side second transfer units 21-1 to 21-m respectively corresponding to the read registers Rreg-1 to Rreg-m, which form the read register group 20.

Each of the read side second transfer units 21-1 to 21-rm is composed of two transistors. For instance, the read register Rreg-1 is connected with read data buses RD, /RD through respective drains and sources of two transistors forming the read side second transfer unit 21-1. Each of the read Y-address signals YR1 to YRm outputted from the read Y-address selector 15 is inputted to each of the read side second transfer units 21-1 to 21-m, and the ON/OFF control of two transistors forming each of the read side second transfer units 21-1 to 21-m is carried out with the read Y-address signals YR1 to YRm.

The read data buses RD, /RD are connected with an output terminal DOUT through the output unit 23.

The input unit 22 located on the write side and the output unit 23 located on the read side are connected with the input/out unit 24 through the write data buses WD, /WD and the read data buses RD, /RD, respectively.

The write/read register group 32 is made up of the write/read registers WRreg-1 to WRreg-m. The number of these write/read registers WRreg-1 to WRreg-m is equal to the number (m pieces) of the write registers Wreg-1 to Wreg-m which form the write register group 17 and also to the number (m pieces) of the read registers Rreg-1 to Rreg-m which form the read register group 20.

The write/read register group 32 is connected with the input/output unit 24 through the write/read transfer unit group 31 and the write/read data buses WRD, /WRD as well. The write/read transfer unit group 31 is made up of the write/read transfer units 31-1 to 31-m which respectively correspond to the write/read registers WRreg-1 to WRreg-m, which form the write/read register group 32.

Each of the write/read transfer units 31-1 to 31-m is made up of two transistors. For instance, the write/read register WRreg-1 is connected with write/read data buses WRD, /WRD through respective drains and sources of two transistors forming the write/read transfer means 31-1. Each of the write/read Y-address signals YWR1 to YWRm outputted from the write/read Y-address selector 30 is inputted to each of the write/read transfer units 31-1 to 31-m, and the ON/OFF control of two transistors forming each of the write/read transfer units 31-1 to 31-m is carried out with the write/read Y-address signals YWR1 to YWRm.

The operation of the serial access memory 101 of the first embodiment will now be described with reference to FIGS. 2, 3, 4, and 5. In starting the write/read operation of the serial access memory 101, a mode signal MODE is inputted to the memory control portion 12, thereby an operational mode being set.

Figure 2:
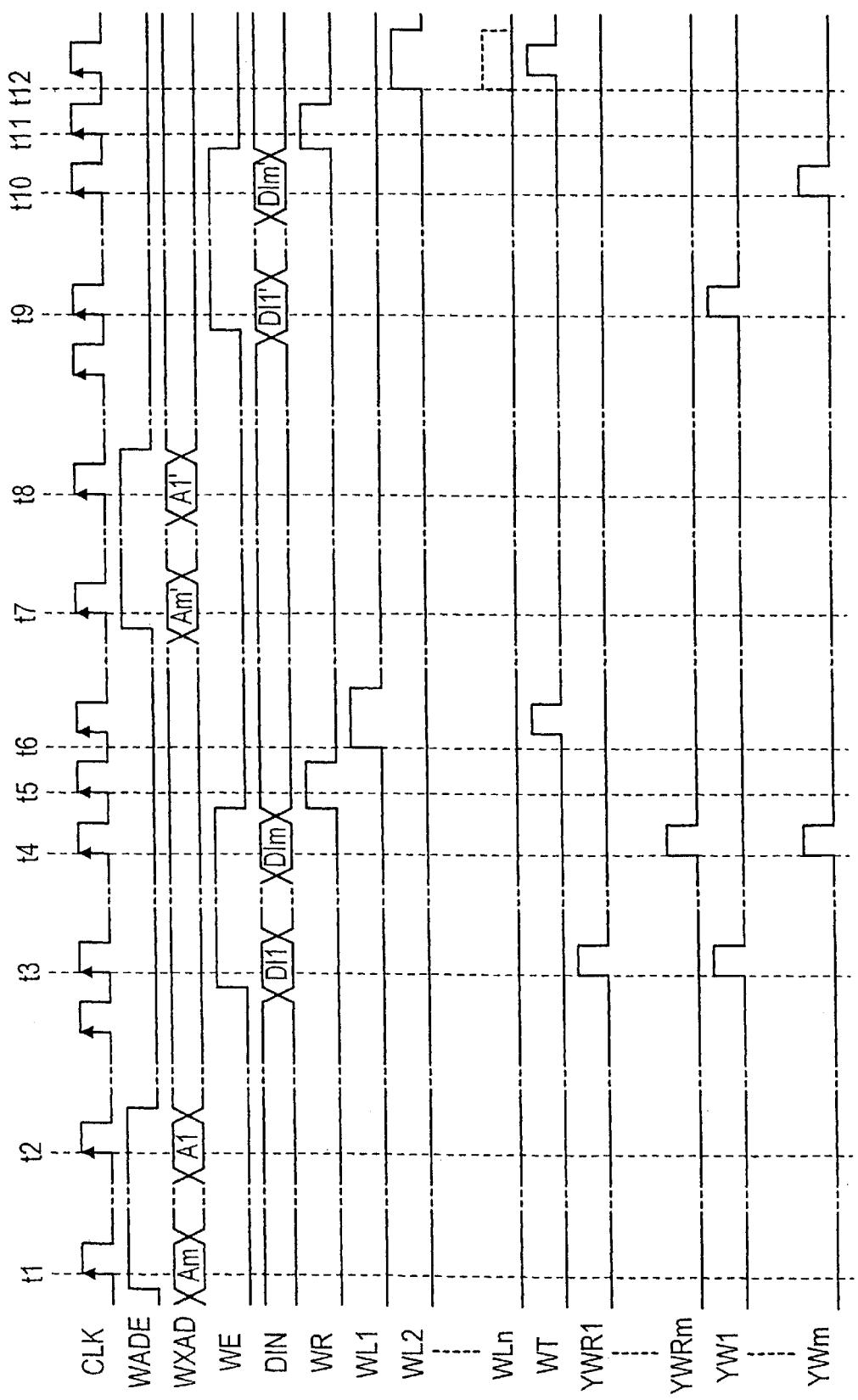
FIG. 2 is a timing chart for describing the write operation (in the first operational mode) of the serial access memory illustrated in FIG. 1.

FIG. 2 is a timing chart for describing the write operation of the serial access memory as set in the first operational mode. The write operation will be described with the passage of time as shown in the figure.
/Time t1/
A write X-address WXAD is serially inputted to the memory control portion 12. At this stage, however, a write address enable signal WADE of the H-level is inputted in advance to the memory control portion 12 in order to enable the memory control portion 12 to take in the write X-address WXAD. To begin with, at time t1, the most significant bit (MSB) data Am of the write X-address WXAD is taken in the memory control portion 12. Thereafter, each bit data of the write X-address WXAD is taken in sequence in the memory control portion 12 in synchronism with a clock signal CLK.
/Time t2/
Then, the least significant bit (LSB) data A1 of the write X-address WXAD is taken in the memory control portion 12, thereby the take-in operation of the write X-address WXAD being completed. At this stage, the write address enable signal WADE to be inputted to the memory control portion 12 is put in the L-level. The write operation will now be described assuming that the word line WL1 is first selected with the write X-address WXAD.
/Time t3/
At time t3 after a predetermined period of time (wait time: about 1.5 µs) has passed away from time t2, the memory control portion 12 detects the write enable signal WE of the H-level in the rise timing of the clock signal CLK. With this, the substantial write operation is commenced. The write Y-address selector 14 selects the write Y-address signal YW1 from the write Y-address signals YW1 to YWm and puts it in the H-level. At the same time, the write/read Y-address selector 30 selects the write/read Y-address signal YWR1 from the write/read Y-address signals YWR1 to YWRm and puts it in the H-level. At this time, the input data DI1 inputted from the input terminal DIN is transmitted to the write data buses WD, /WD through the input unit 22 and is also transmitted to the write/read data buses WRD, /WRD through the input/output unit 24. Since the write side second transfer unit 18-1 is put in the ON state with the write Y-address signal YW1 of the H-level, the input data DI1 is stored in the write register Wreg-1. On one hand, since the write/read transfer unit 31-1 is put in the ON state with the write/read Y-address signal YWR1 of the H-level, the input data DI1 is stored also in the write/read register WRreg-1.
/Time t3 to t4/
Up to time t4 after time t3, the write Y-address selector 14 selects in sequence the write Y-address signals YW2 to YWm from the write Y-address signals YW1 to YWm in synchronism with the clock signal CLK and puts each of them in the H-level. In parallel with this, the write/read Y-address selector 30 selects in sequence the write/read Y-address signals YWR2 to YWRm from the write/read Y-address signals YWR1 to YWRm in synchronism with the clock signal CLK and puts each of them in the H-level. On one hand, the input data DI2 to DIm are inputted in sequence to the input terminal DIN, and each of the input data DI2 to DIm is stored in each of the write registers Wreg-2 to Wreg-m through the input unit 22 and the write data buses WD, /WD, and is further stored in the write/read registers WRreg-2 to WRreg-m through the input unit 22, the write data buses WD, /WD, input/output unit 24, and the write/read data buses WRD, /WRD.
/Time t5/
A write reset signal WR of the H-level being inputted to the memory control portion 12, there is commenced the transfer of the input data DI1 to DIm (one word) stored in the write register group 17 to the memory cell array 11.
/Time t6/
The word line WL1 selected in the period of time t1 through t2 is put in the H-level by the X-address selector 13 and further, the control signal WT is put in the H-level by the memory control portion 12. As the result of this, the input data DI1 to DIm stored in the write register group 17 are transferred to the memory cells MC11 to MCm1 connected with the word line WL1 all at once. At this time, the same data DI1 to DIm are stored in the memory cells MC11 to MCm1 connected with the word line WL1 and the write/read registers WRreg-1 to WRreg-m as well.
/Time t7/
Again, the write X-address WXAD is serially inputted to the memory control portion 12. At this stage, the write address enable signal WADE of the H-level is inputted in advance to the memory control portion 12 in order to enable the memory control portion 12 to take in the write X-address WXAD. At time t7, the most significant bit (MSB) data Am' of the write X-address WXAD is taken in the memory control portion 12. After that, each bit data of the write X-address WXAD is taken in sequence in the memory control portion 12 in synchronism with a clock signal CLK.
/Time t8/
Then, the least significant bit (LSB) data A1' of the write X-address WXAD is taken in the memory control portion 12, thereby the take-in operation of the write X-address WXAD being completed. At this stage, the write address enable signal WADE to be inputted to the memory control portion 12 is put in the L-level. The write operation will be described here assuming that the word line WL2 is selected with the write X-address WXAD following the first selection of the word line WL1 as described above.
/Time t9/
At time t9 after a predetermined period of time (wait time: about 1.5 µs) has passed away from time t8, the memory control portion 12 detects the write enable signal WE of the H-level in the rise timing of the clock signal CLK. With this, the substantial write operation is commenced. The write Y-address selector 14 selects the write Y-address signal YW1 from the write Y-address signals YW1 to YWm and puts it in the H-level. At this time, the input data DI1' inputted from the input terminal DIN is transmitted to the write data buses WD, /WD through the input unit 22. Since the write side second transfer unit 18-1 is put in the ON state with the write Y-address signal YW1 of the H-level, the input data DI1' is stored in the write register Wreg-1.

/Time t9 to t10/

Up to time t10 after time t9, the write Y-address selector 14 selects in sequence the write Y-address signals YW2 to YWm from the write Y-address signals YW1 to YWm in synchronism with the clock signal CLK and puts each of them in the H-level. The input data DI2' to DIm' are inputted in sequence to the input terminal DIN, and each of the input data DI2' to DIm' is stored in each of the write registers Wreg-2 to Wreg-m through the input unit 22 and the write data buses WD, /WD.

/Time t11/

The write reset signal WR of the H-level being inputted to the memory control portion 12, it is commenced to transfer the input data DI1' to DIm' stored in the write register group 17 to the memory cell array 11 all at once.

/Time t12/

The word line WL2 selected in the period of time t7 through t8 is put in the H-level by the X-address selector 13 and further, the control signal WT is put in the H-level by the memory control portion 12. As the result of this, the input data DI1' to DIm' stored in the write register group 17 are transferred to the memory cells MC12 to MCm2 connected with word line WL2 all at once.

The above is an example of the write operation of the serial access memory 101 when it is set in the first operational mode. In this example, the word line WL1 is selected at first and the word line WL2 is selected subsequently, and the data are stored in the memory cells connected with the selected word line. However, the order of the word line to be selected and the order of selection may be suitably set with the write X-address WXAD as inputted externally. For instance, at time t12, the word line WLn(broken line portion in FIG. 2) may be selected instead of the word line WL2. That is, according to this write operation, the word lines WL1 to WLn may be selected at random and the data is written in the memory cell connected with the selected word line. As described above, the write operation of the serial access memory 101 as set in the first operational mode is equivalent to the write operation of the prior art serial access memory of the line access type.

In the next, the write operation of the serial access memory 101 as set in the second operational mode according to a mode signal MODE will be described with reference to FIG. 3.

/Time t1/

The write operation starts when the write reset signal WR is inputted to the memory control portion 12. The memory control portion 12 detects the write reset signal WR of the H-level in the rise timing of the clock signal CLK.

/Time t2/

The write Y-address selector 14 selects the write Y-address signal YW1 from the write Y-address signals YW1 to YWm and puts it in the H-level. At the same time, the write/read Y-address selector 30 selects the write/read Y-address signal YWR1 from write/read Y-address signals YWR1 to YWRm and puts it in the H-level. At this time, the input data DI1 inputted from the input terminal DIN is transmitted to the write data buses WD, /WD through the input unit 22 and is also transmitted to the write/read data buses WRD, /WRD through the input/output unit 24. Since the write side second transfer unit 18-1 is put in the ON state with the write Y-address signal YW1 of the H-level, the input data DI1 is stored in the write register Wreg-1. On one hand, since the write/read transfer unit 31-1 is put in the ON state with the write/read Y-address signal YWR1 of the H-level, the input data DI1 is also stored in the write/read register WRreg-1.

/Time t2 to t3/

Up to time t3 after time t2, the write Y-address selector 14 selects in sequence the write Y-address signals YW2 to YWm from the write Y-address signals YW1 to YWm in synchronism with the clock signal CLK and puts each of them in the H-level. In parallel with this, the write/read Y-address selector 30 selects in sequence the write/read Y-address signals YWR2 to YWRm from the write/read Y-address signals YWR1 to YWRm in synchronism with the clock signal CLK and puts each of them in the H-level. On one hand, the input data DI2 to DIm are inputted in sequence to the input terminal DIN, and each of the input data DI2 to DIm is stored in each of the write registers Wreg-2 to Wreg-m through the input unit 22 and the write data buses WD, /WD, and is further stored in the write/read registers WRreg-2 to WRreg-m through the input unit 22, the write data buses WD, /WD, input/output unit 24, and the write/read data buses WRD, /WRD.

/Time t4/

The word line WL1 is put in the H-level by the X-address selector 13 and further, the control signal WT is put in the H-level by the memory control portion 12. As the result of this, the input data DI1 to DIm stored in the write register group 17 are transferred to the memory cells MC11 to MCm1 connected with the word line WL1 all at once. At this time, the same data DI1 to DIm are stored in the memory cells MC11 to MCm1 connected with the word line WL1 and the write/read registers WRreg-1 to WRreg-m as well.

/Time t5/

The write Y-address selector 14 selects the write Y-address signal YW1 from the write Y-address signal YW1 to YWm. At this time, the input data DI1' inputted from the input terminal DIN is transmitted to the write data buses WD, /WD through the input unit 22. Since the write side second transfer unit 18-1 is put in the ON state with the write Y-address signal YW1 of the H-level, the input data DI1' is stored in the write register Wreg-1.

/Time t5 to t6/

Up to time t6 after time t5, the write Y-address selector 14 selects in sequence the write Y-address signals YW2 to YWm from the write Y-address signals YW1 to YWm in synchronism with the clock signal CLK and puts each of them in the H-level. The input data DI2' to DIm' are inputted in sequence to the input terminal DIN, and are correspondingly stored in the write registers Wreg-2 to Wreg-m through the write data buses WD, /WD.

/Time t7/

The word line WL2 is put in the H-level by the X-address selector 13 and further, the control signal WT is put in the H-level by the memory control portion 12. As the result of this, the input data DI1' to DIm' stored in the write register group 17 are transferred to the memory cells MC12 to MCm2 connected with the word line WL2 all at once.

/Time t7 and Thereafter/

The input data are respectively stored in memory cell arrays MC13 to MCm3, . . . , and MC1n to MCmn connected with each of the word lines WL3 to WLn by repeating the operation carried out in the period of time t2 through t7, incrementing the address of the word line by one each.

The above is an example of the write operation when the serial access memory 101 is set in the second operational mode. According to this write operation, the word lines WL1 to WLn are selected in sequence and the data is written in the memory cells connected with the selected word line without inputting the write X-address WXAD externally. As described above, the write operation of the serial access memory 101 as set in the second operational mode is equivalent to the write operation of the prior art serial access memory of the FIFO type.

Further more, the serial access memory 101 according to the first embodiment is separately provided with another circuit (not shown) having the same structure as the circuit shown in FIG. 1, that is, the serial access memory 101 adopts the dual bank structure. The input data inputted in sequence to the input terminal DIN in the period of time t4 through t5 as shown in FIG. 3 is inputted once to the write register belonging to the other bank, and is then written in the memory cell array belonging to the other bank.

In the next, the read operation of the serial access memory 101 as set in the first operational mode based on the mode signal MODE will be described with reference to FIG. 4.

/Time t1/

A read X-address RXAD is inputted to the memory control portion 12. At this stage, however, a read address enable signal RADE of the H-level is inputted in advance to the memory control portion 12 in order to enable the memory control portion 12 to take in the read X-address. To begin with, at time t1, the most significant bit (MSB) data Am of the read X-address RXAD is taken in the memory control portion 12. Thereafter, each bit data of the read X-address RXAD is taken in sequence in the memory control portion 12 in synchronism with a clock signal CLK.

/Time t2/

Then, the least significant bit (LSB) data A1 of the read X-address RXAD is taken in the memory control portion 12, thereby the take-in operation of the read X-address RXAD being completed. At this stage, the read address enable signal RADE to be inputted to the memory control portion 12 is put in the L-level. The read operation will now be described assuming that the word line WL1 is selected with the read X-address RXAD.

/Time t3/

The word line WL1 selected at time t2 is put in the H-level by the X-address selector 13 and further, the control signal RT is put in the H-level by the memory control portion 12. As the result of this, each data stored in the memory cells MC11 to MCm1 connected with the word line WL1 is transferred to the read registers Rreg-1 to Rreg-m through the read side first transfer group 19 all at once.

/Time t4/

The memory control portion 12 detects the read enable signal RE of the H-level in the rise timing of the clock signal CLK. The read Y-address selector 15 selects a read Y-address signal YR1 from the read Y-address signals YR1 to YRm and puts it in the H-level. Since the read side second transfer unit 21-1 is put in the ON state with the read Y-address signal YR1 of the H-level, the data stored in the read register Rreg-1 is transmitted to the read data buses RD, /RD. The data transmitted to the read data buses RD, /RD is outputted to the output terminal DOUT through the output unit 23 as the output data DO1.

/Time t4 to t5/

Up to time t5 after time t4, the read Y-address selector 15 selects in sequence the read Y-address signals YR2 to YRm from the read Y-address signals YR1 to YRm in synchronism with the clock signal CLK and puts each of them in the H-level. As this goes on, each data stored in the read registers Rreg-2 to Rreg-m is transmitted in sequence to the read data buses RD, /RD. Each data sequentially transmitted to the read data buses RD, /RD is outputted to the output terminal DOUT as the output data DO2 to DOm through the output unit 23.

The above is an example of the read operation of the serial access memory 101 as set in the first operational mode. In this example, the word line WL1 is selected and the storage data of the memory cell connected with the selected word line is read out. However, the word line to be selected may be suitably set with the read X-address RXAD inputted externally. That is, according to this read operation, the word lines WL1 to WLn are selected at random and the storage data is read out from the memory cell connected with the word line as selected at random. Accordingly, the read operation of the serial access memory 101 as set in the first operational mode is equivalent to the read operation of the prior art serial access memory of the line access type.

Figure 3:
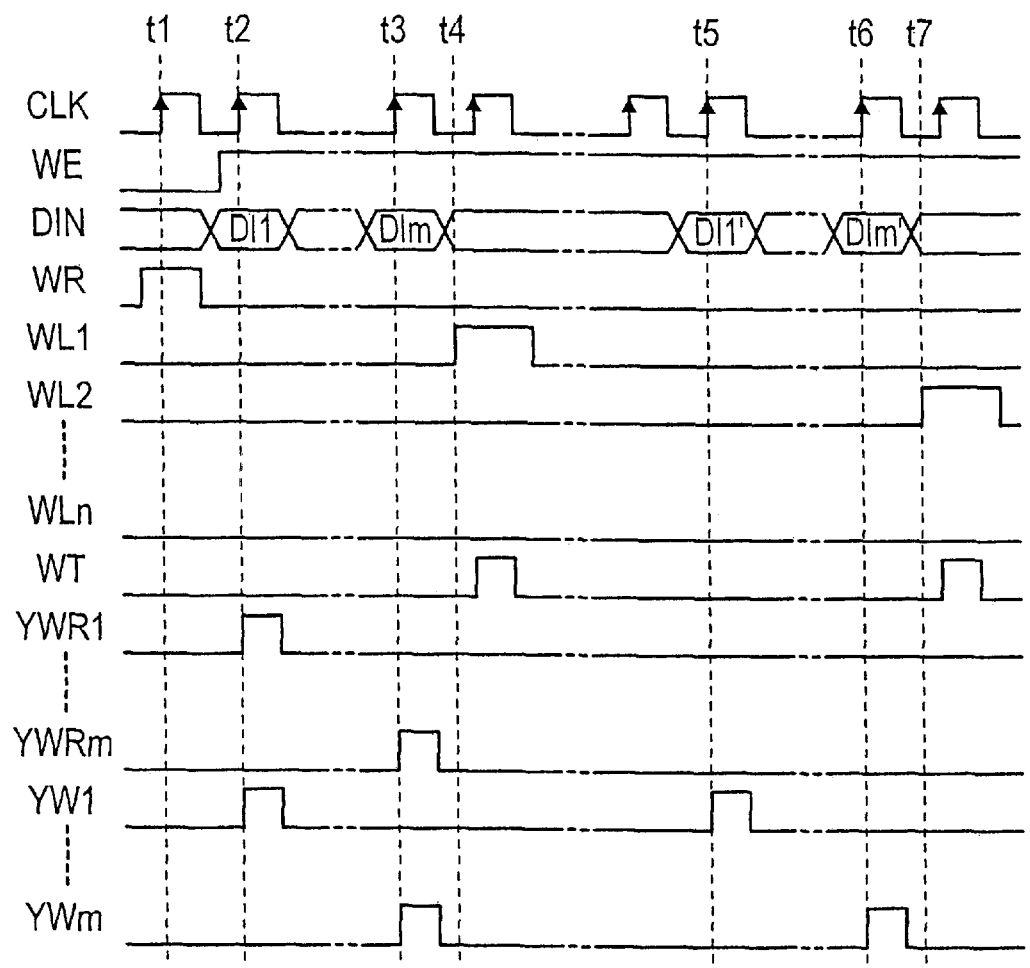
FIG 3 is a timing chart for describing the write operation (in the second operation mode) of the serial access memory illustrated in FIG. 1.
Figure 4:
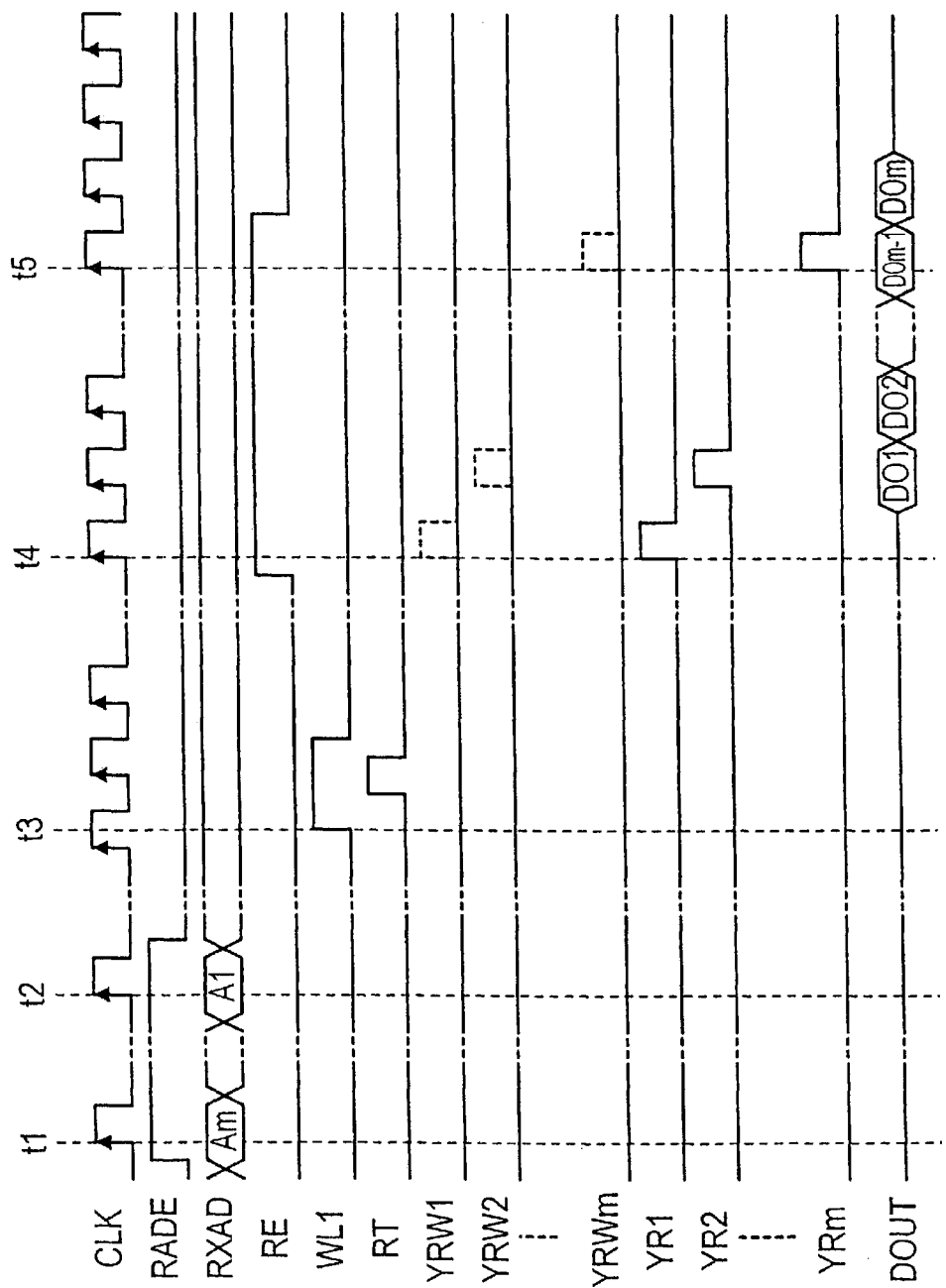
FIG. 4 is a timing chart for describing the read operation (in the first operational mode) of the serial access memory illustrated in FIG. 1.

In the read operation as shown in FIG. 4, the storage data of memory cells MC11 to MCm1 connected with the word line WL1 are read out by selecting the read Y-address signals YR1 to YRm in sequence in the period of time t4 to t5. By the way, as described above, according to the write operation of the serial access memory 101, the same data as the storage data of the memory cells MC11 to MCm1 connected with the word line WL1 is stored in the write/read register WRreg-1 to WRreg-m. In the read operation of the serial access memory 101, therefore, the storage data may be read out not from the memory cells MC11 to MCm1 but from the write/read registers WRreg-1 to WRreg-m (broken line in FIG. 4). In this case, the common writing of the input data DI1 to DIm to the write registers Wreg-1 to Wreg-m and to the write/read registers WRreg-1 to WRreg-m as well become unnecessary, which is executed in the first operational mode write operation in the period of time t3 to t4 shown in FIG. 2, and the latter being executed in the second operational mode write operation in the period of time t2 to t3 shown in FIG. 3. In other words, the writing of the input data DI1 to DIm to the write registers Wreg-1 to Wreg-m can be omitted, which leads to the electric power saving. Furthermore, this makes it possible to eliminate the memory cells connected with the word line WL1 or to handle such memory cells as a dummy.

In the next, the read operation of the serial access memory 101 as set in the second operational mode based on the mode signal MODE will be described with reference to FIG. 5.

/Time t1/

The read operation starts when the read reset signal RR is inputted to the memory control portion 12. The memory control portion 12 detects the read reset signal RR of the H-level in the rise timing of the clock signal CLK. The write/read Y-address selector 30 selects the write/read Y-address signal YWR1 from the write/read Y-address signals YWR1 to YWRm and puts it in the H-level. Since the write/read transfer unit 31-1 is put in the ON state with the write/read Y-address signal YWR1 of the H-level, the data stored in the write/read register WRreg-1 is outputted to the write/read data buses WRD, /WRD, and further outputted to the output terminal DOUT as the data DO1 through the input/output unit 24, the read data buses RD, /RD, and the output unit 23. In this read operation, the first output data DO1 is outputted after the input of the read reset signal RR without waiting for the passage of the wait time.

/Time t2/

The word line WL2 is put in the H-level with by the X-address selector 13 and further, the control signal RT is put in the H-level by the memory control portion 12. As the result of this, each data stored in the memory cells MC12 to MCm2 connected with the word line WL2 is transferred to the read register Rreg-1 to Rreg-m through the read side first transfer unit group 19 all at once. In the manner like this, if the storage data of the memory cells MC12 to MCm2 connected with the word line WL2 is transferred to the read registers Rreg-1 to Rreg-m in parallel with the read operation of the data from the write/read registers WRreg-1 to WRreg-m, it becomes possible to start the read operation of the data from the read registers Rreg-1 to Rreg-m immediately after completing the read operation of the data from the write/read registers WRreg-1 to WRreg-m.

/Time t3/

The write/read Y-address selector 30 selects the write/read Y-address signal YWR2 from the write/read Y-address signals YWR1 to YWRm in synchronism with the clock signal CLK and puts it in the H-level. Since the write/read transfer unit 31-2 is put in the ON state with the write/read Y-address signal YWR2 of the H-level, the data stored in the write/read register WRreg-2 is outputted to the write/read data buses WRD, /WRD, and further outputted to the output terminal DOUT as the output data DO2 through the input/output unit 24, the read data buses RD, /RD, and the output unit 23.

/Time t3 to t4/

Up to time t4 after time t3, the write/read Y-address unit 30 selects the write/read Y-address signals YWR2 to YWRm from the write/read Y-address signals YWR1 to YWRm in synchronism with the clock signal CLK and puts each of them in the H-level. As this goes on, each data stored in the write/read registers WRreg-2 to WRreg-m is outputted in sequence to the write/read data buses WRD, /WRD, and further outputted to the output terminal DOUT as the output data DO2 to DOm through the input/output unit 24, the read data buses RD, /RD, and the output unit 23.

/Time t5/

The read Y-address selector 15 selects the read Y-address signal YR1 from the read Y-address signals YR1 to YRm in synchronism with the clock signal CLK and puts it in the H-level. Since the read side second transfer unit 21-1 is put in the ON state with the read Y-address signal YWR1 of the H-level, the data stored in the read register Rreg-1 is transmitted to the output unit 23 through the read data buses RD, /RD and outputted as the output data DO1' to the output terminal DOUT.

/Time t6/

The read Y-address selector 15 selects the read Y-address signal YR2 from the read Y-address signals YR1 to YRm in synchronism with the clock signal CLK and puts it in the H-level. Since the read side second transfer unit 21-2 is put in the ON state with the read Y-address signal YR2 of the H-level, the data stored in the read register Rreg-2 is transmitted to the output unit 23 through the read data buses RD, /RD and outputted as the output data D2' to the output terminal DOUT.

/Time t6 and Thereafter/

The read Y-address selector 15 selects in sequence the read Y-address signal YR2 to YRm from the read Y-address signals YR1 to YRm in synchronism with the clock signal CLK and puts each of them in the H-level. As this goes on, each data stored in the read registers Rreg-2 to Rreg-m is transmitted in sequence to the output unit 23 through the read data buses RD, /RD and outputted to the output terminal DOUT as the output data DO2' to DOm'.

The above is an example of the read operation of the serial access memory 101 as set in the second operational mode. According to this example, the word lines WL1 to WLn are selected in due order without externally inputting the read X-address RXAD, and the storage data of the memory cell connected with the selected word line is read out. However, the word line to be selected may be suitably set with the read X-address RXAD inputted externally. Like this, the read operation of the serial access memory 101 as set in the second operational mode is equivalent to the read operation of the prior art serial access memory of the FIFO access type.

As described above, according to the serial access memory 101 and the write/read operation thereof, it becomes possible to suitably select and execute either the write/read operation of the prior art serial access memory of the line access type or the same of the prior art serial access memory of the FIFO type.

Second Embodiment

Figure 6:
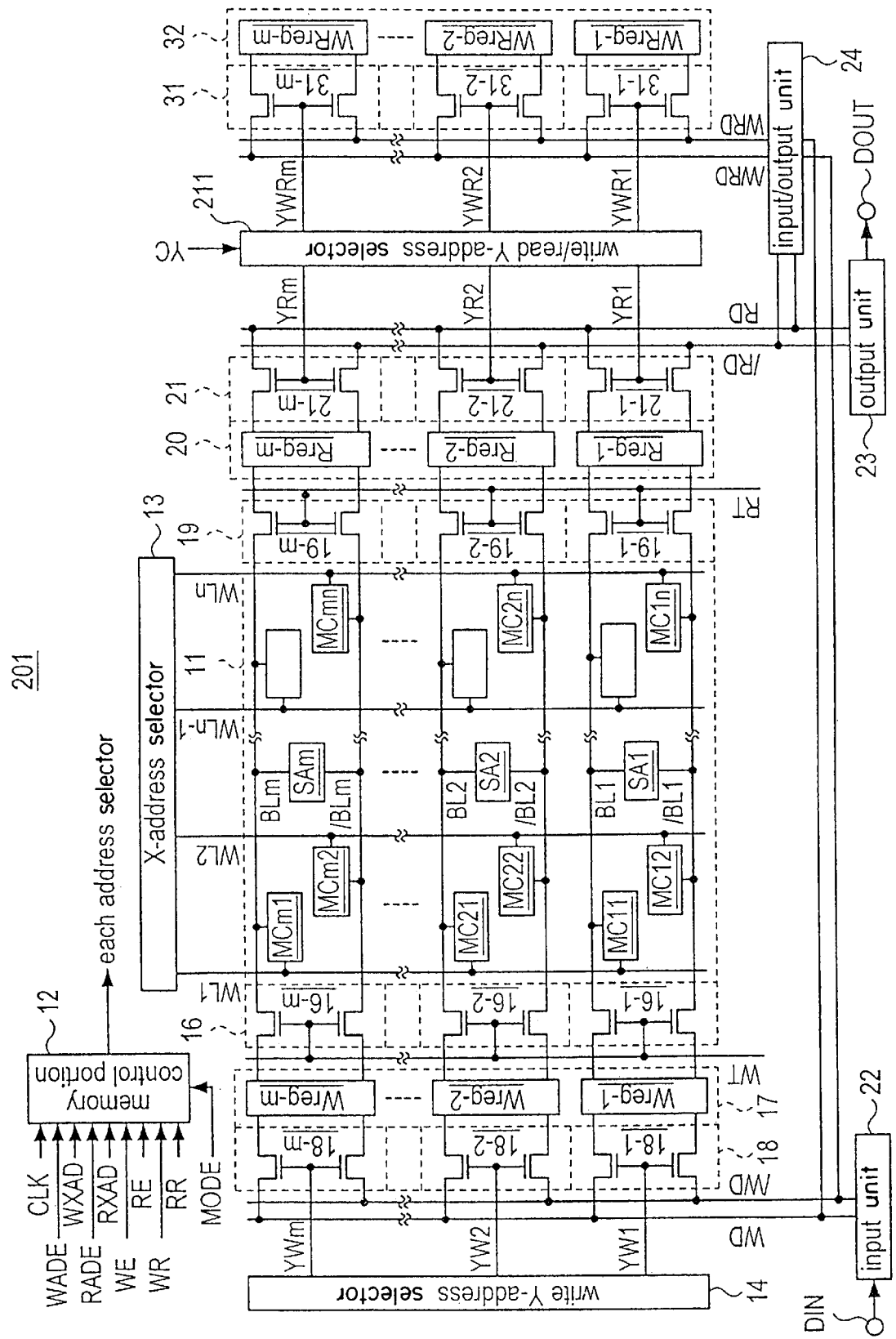
FIG. 6 is a circuit diagram for showing the structure of a serial access memory according to the second embodiment of the invention.

FIG. 6 is a diagrammatic view showing the structure of a serial access memory 201 according to the second embodiment of the invention.

This serial access memory 201 can be formed by substituting a write/read Y-address selector 211 for the read Y-address selector 15 and the write/read Y-address selector 30 of the serial access memory 101 according to the first embodiment as described previously. That is, the serial access memory 201 is provided with a memory cell array 11, a memory control portion 12, an X-address selector 13, a write Y-address selector 14, a write side first transfer unit group 16, a write register group 17, a write side second transfer unit group 18, a read side first transfer unit group 19, a read register group 20, a read side second transfer unit group 21, an input unit 22, an output unit 23, an input/output unit 24, a write/read transfer unit group 31, a write/read register group 32, and a write/read Y-address selector 211.

The write/read Y-address selector 211 serves as both of the write Y-address selector 15 and the write/read Y-address selector 30, which are included as elements for forming the serial access memory 101 according to the first embodiment as described previously. This write/read Y-address selector 211 further serves to output the read Y-address signal YR1 to YRm to each gate of the transistors forming the read side second transfer units 21-1 to 21-m and also serves to output the write/read Y-address signals YWR1 to YWRm to each of transistors forming the write/read transfer units 31-1 to 31-m. Still further, this write/read Y-address selector 211 serves to enable either the output port of the read Y-address signal YR1 to YRm or the output port of the write/read Y-address signal YWR1 to YWRm according to a switch signal YC outputted from the memory control portion 12.

Figure 5:
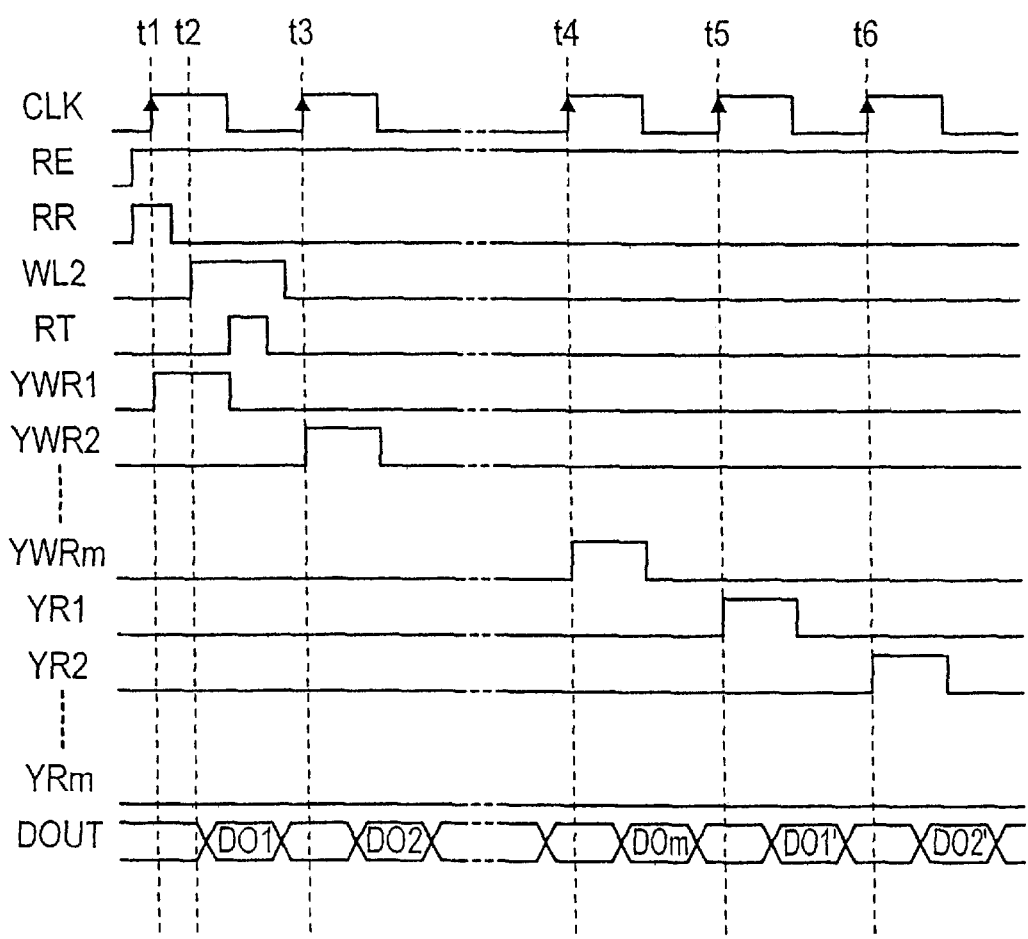
FIG. 5 is a timing chart for describing the read operation (in the second operational mode) of the serial access memory illustrated in FIG. 1.

It is apparent from FIGS. 2 and 3 showing the write operation of the serial access memory 101 and FIGS. 4 and 5 showing the read operation of the same, no overlap takes place between the output timing of the read Y-address signal YR1 to YRm and that of the write/read Y-address signal YWR1 to YWRm. Therefore, if the switch signal YC is supplied to the write/read Y-address selector 211 in a suitable timing, the serial access memory 201 is able to execute the almost same write/read operation as the serial access memory 101.

The serial access memory 201 as set in the first operational mode (equivalent to the line access type) or in the second operational mode (equivalent to the FIFO type) executing the write operation, the memory control portion 12 outputs the switch signal YC to the write/read Y-address selector 211 and instructs it to enable the output port of the write/read Y-address signal YWR1 to YWRm regardless of the operational mode as set above.

The serial access memory 201 as set in the first operational mode (equivalent to the prior art line access type) executing the read operation, the memory control portion 12 outputs the switch signal YC to the write/read Y-address selector 211 and instructs it to enable the output port of the write/read Y-address signal YWR1 to YWRm only when the inputted read X-address RXAD indicates the leading word line (i.e. word line WL1), but instructs it to enable the output port of the read Y-address signals YR1 to YRm when the inputted read X-address RXAD indicates the other than the above word line.

The serial access memory 201 as set in the second operational mode (equivalent to the prior art FIFO type) executing the read operation, the memory control portion 12 outputs the switch signal YC to the write/read Y-address selector 211 and instructs it to enable the output port of the write/read Y-address signals YWR1 to YWRm on the only one line access that is made immediately after the read reset signal RR is inputted, but thereafter, instructs it to enable the output port of the read Y-address signals YR1 to YRm.

As described above, the serial access memory 201 according to the second embodiment can provide the same effect as the serial access memory 101 according to the first embodiment. In addition, there can be realized reduction in the scale of the electronic circuit of the serial access memory.

Furthermore, the serial access memory 201 executing the write operation, it may be possible to transfer the input data DI1 to DIm relating to the leading line address (i.e. relating to the leading word line WL1) not to the write registers Wreg-1 to Wreg-m, but to transfer them only to the write/read registers WRreg-1 to WRreg-m to store them there. In this case, the read operation is carried out such that the data is read not from the memory cells MC11 to MCm1 but from the write/read registers WRreg-1 to WRreg-m. Thus, according to this data write/read method, the step of writing the input data DI1 to DIm to the write registers Wreg-1 to Wreg-m can be omitted, so that reduction of the power consumption can be expect. In addition, it becomes possible to eliminate the word line WL1 and the memory cells connected therewith or to handle them dummies.

Third Embodiment

Figure 7:
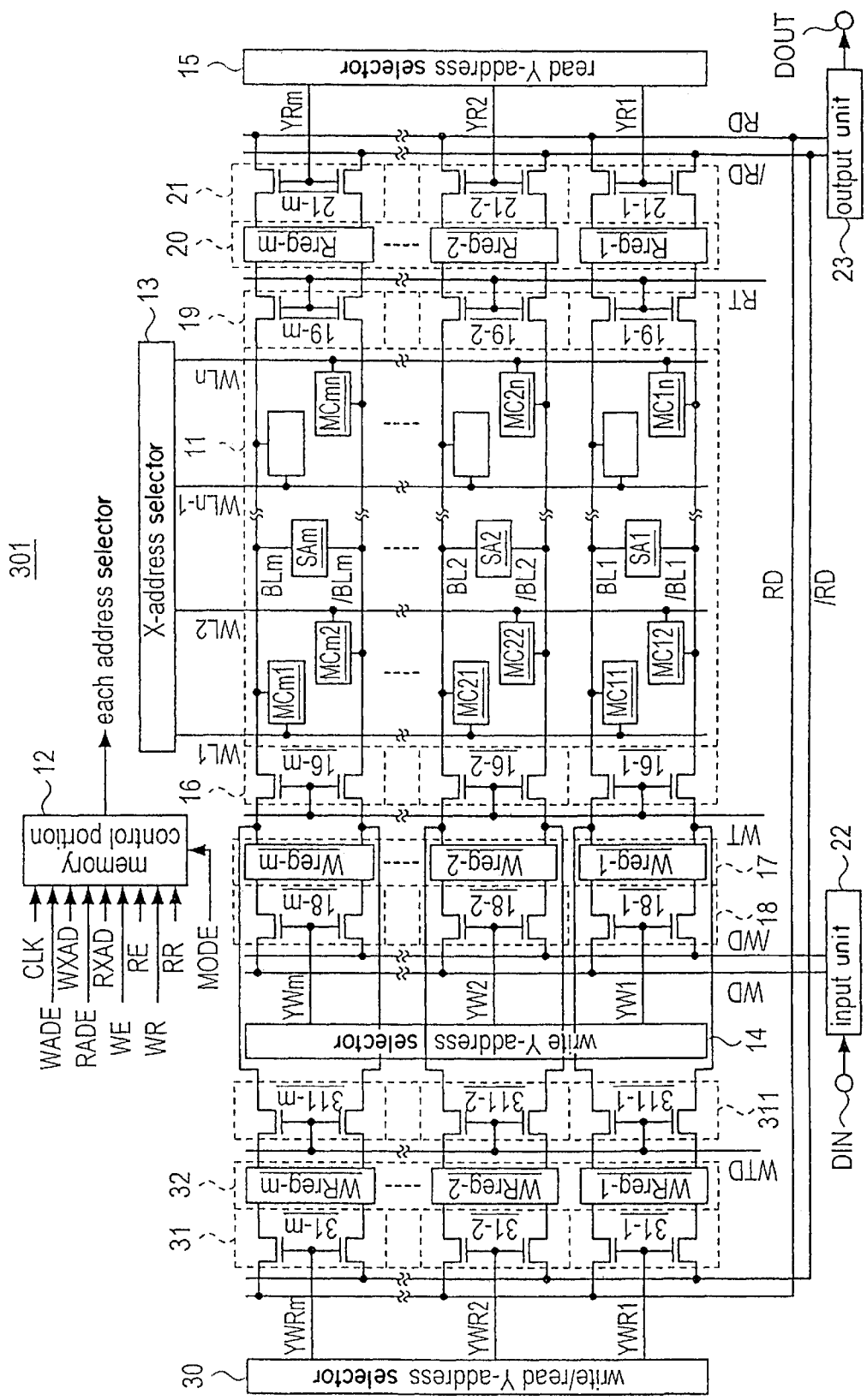
FIG. 7 is a circuit diagram for showing the structure of a serial access memory according to the third embodiment of the invention.

FIG. 7 is a diagrammatic view showing the structure of a serial access memory 301 according to the third embodiment of the invention.

This serial access memory 301 has such a structure that is obtained by adding a write side third transfer unit group 311 to the serial access memory 101 (the first embodiment), eliminating the input/output unit 24 from the serial access memory 101, and further moving all of the write/read Y-address selector 30, the write/read transfer unit group 31, and the write/read register group 32 to the write side of the serial access memory 101 from the read side thereof. That is, the serial access memory 301 is provided with a memory cell arra 11, a memory control portion 12, an X-address selector 13, a write Y-address selector 14, a read Y-address selector 15, a write side first transfer unit group 16, a write register group 17, a write side second transfer unit group 18, a read side first transfer unit group 19, a read register group 20, a read side second transfer unit group 21, an input unit 22, an output unit 23, write/read Y-address selector 30, a write/read transfer unit group 31, a write/read register group 32, and a write side third transfer unit group 311.

The write side third transfer unit group 311 is made up of the write side third transfer units 311-1 to 311-m, which respectively corresponds to the write registers Wreg-1 to Wreg-m. Each of the write side third transfer units 311-1 to 311-m is made up of two transistors. The ON/OFF control of these 2×m transistors forming the write side third transfer units 311-1 to 311-m is carried out with a control signal WTD. For instance, the data stored in the write register Wreg-1 is transferred to the write/read register WRreg-1 through the respective drains and sources of two transistors by turning on two transistors forming the write side third transfer unit 311-1.

The write/read register group 32 is connected with the read data buses RD, /RD through the write/read transfer unit group 31. The write/read transfer unit group 31 is made up of the write/read transfer units 31-1 to 31-m which respectively correspond to the write/read registers WRreg-1 to WRreg-m which form the write/read register group 32.

Each of the write/read transfer units 31-1 to 31-m is made up of two transistors. For instance, the write/read register WRreg-1 is connected with the read data buses RD, /RD through drains and sources of two transistors which form the write/read transfer unit 31-1. The write/read Y-address signals YWR1 to YWRm outputted from the write/read Y-address selector 30 are correspondingly inputted to the write/read transfer units 31-1 to 31-m, and the ON/OFF control of two transistors forming each of the write/read transfer units 31-1 to 31-m is carried out with the write/read Y-address signals YWR1 to YWRm.

The operation of the serial access memory 301 made up as described above will now be described with reference to FIGS. 8 and 9. In starting the write/read operation of the serial access memory 301, a mode signal MODE is inputted to the memory control portion 12, thereby setting the operational mode of the serial access memory 301.

Figure 8:
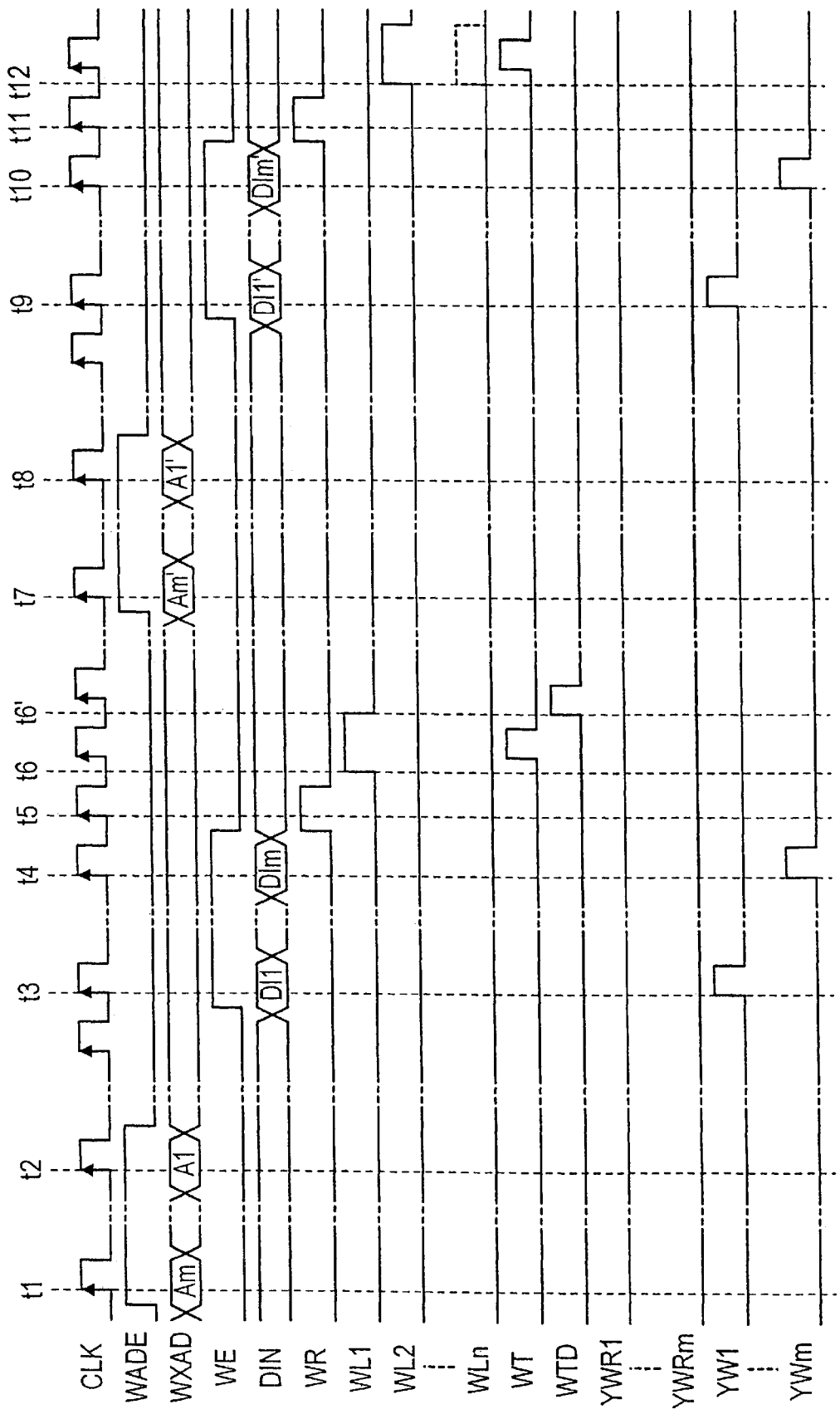
FIG. 8 is a timing chart for describing the write operation (in the first operations mode) of the serial access memory illustrated in FIG. 7.
Figure 9:
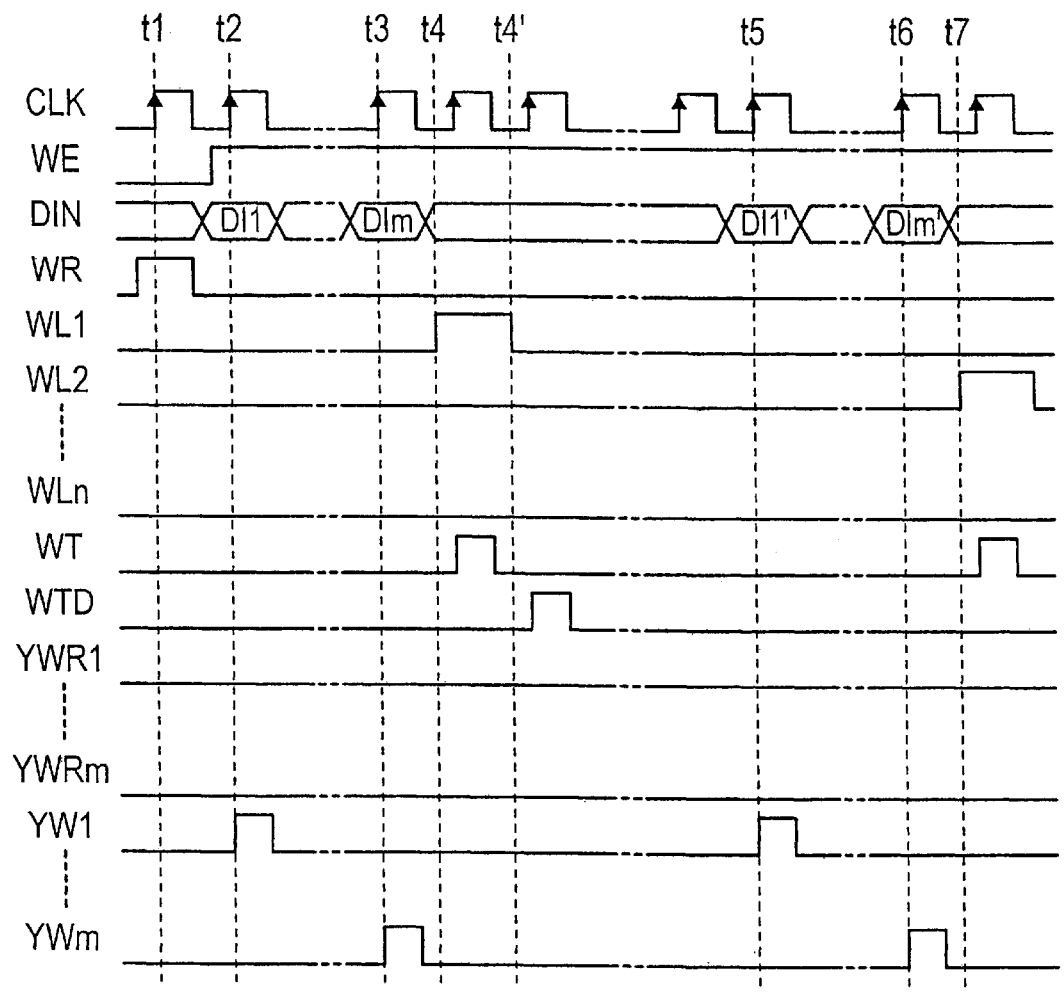
FIG. 9 is a timing chart for describing the write operation (in the second operational mode) of the serial access memory illustrated in FIG. 7.

FIG. 8 is a timing chart for describing the write operation of the serial access memory 301 as set in the first operational mode. The write operation of the serial access memory 301 as set in the first operational mode is different from that of the serial access memory 101 (the first embodiment) as shown in FIG. 2 with respect to the data transfer operation to the write/read registers WRreg-1 to WRreg-m. Thus, the following description will be made focusing on the difference therebetween.

/Time t1 Through t2/

The write operation of the serial access memory 301 in the period of time t1 through t2 is identical to that of the serial access memory 101.

/Time t3/

The write Y-address selector 14 selects the write Y-address signal YW1 from the write Y-address signals YW1 to YWm and puts it in the H-level. Since the write side second transfer unit 18-1 is put in the ON state with the write Y-address signal YW1 of the H-level, the input data DI1 is stored in the write register Wreg-1. This operation is common to both of the serial access memory 301 and the serial access memory 101.

However, according to the write operation of the serial access memory 101 at time t3, the write/read Y-address selector 30 selects the write/read Y-address signal YWR1 from the write/read Y-address signals YWR1 to YWRm and puts it in the H-level (FIG. 2). On one hand, according to the write operation of the serial access memory 301, the write/read Y-address selector 30 keeps all the write/read Y-address signals YWR1 to YWRm in the L-level state (FIG. 8).

/Time t3 Through t4/

Similar to the above, according to the write operation of the serial access memory 301 in the period of time t3 to t4, the write Y-address selector 14 selects in sequence the write Y-address signals YW2 to YWm and puts them in the H-level, but the write/read Y-address selector 30 keeps all the write/read Y-address signals YWR2 to YWRm in the L-level state. As the result of this, the input data DI1 to DIm are stored only in the write registers Wreg-1 to Wreg-m, not in the write/read registers WRreg-1 to WRreg-m.

/Time t5/

The write reset signal WR of the H-level being inputted to the memory control portion 12, there is commenced the transfer of the input data DI1 to DIm stored in the write register group 17 to the memory cell array 11.

/Time t6/

The word line WL1 selected in the period of time t1 through t2 is put in the H-level by the X-address selector 13 and further, the control signal WT is put in the H-level by the memory control portion 12. As the result of this, the input data DI1 to DIm stored in the write register group 17 are transferred to the memory cells MC11 to MCm1 connected with the word line WL1 all at once.

/Time t6'/

A control signal WTD is put in the H-level by the memory control portion 12. With this, the input data DI1 to DIm stored in the write register group 17 are transferred to the write/read register group 32 all at once. At this time, the same data DI1 to DIm are stored in both of the memory cells MC11 to MCm1 connected with the word line WL1 and the write/read registers WRreg-1 to WRreg-m.

/Time t7 and Thereafter/

The write operation of the serial access memory 301 at time t7 and thereafter is identical to that of the serial access memory 101.

The above is an example of the write operation of the serial access memory 301 as set in the first operational mode.

In the next, the write operation of the serial access memory 301 as set in the second operational mode, is described with reference to FIG. 9. The write operation of the serial access memory 301 as set in the second operational mode is different from that of the serial access memory 101 as shown in FIG. 3 with respect to the data transfer operation to the write/ read registers WRreg-1 to WRreg-m. Thus, the following description will be made focusing on the difference therebetween.

/Time t1/

The write operation of the serial access memory 301 at time t1 is identical to that of the serial access memory 101.

/Time t2/

The write Y-address selector 14 selects the write Y-address signal YW1 from the write Y-address signals YW1 to YWm and puts it in the H-level. Since the write side second transfer unit 18-1 is put in the ON state with the write Y-address signal YW1 of the H-level, the input data DI1 is stored in the write register Wreg-1. This operation is common to both of the serial access memory 301 and the serial access memory 101.

However, according to the write operation of the serial access memory 101 at time t2, the write/read Y-address selector 30 selects the write/read Y-address signal YWR1 from the write/read Y-address signals YWR1 to YWRm and puts it in the H-level (FIG. 3). On one hand, according to the write operation of the serial access memory 301, the write/ read Y-address selector 30 keeps all the write/read Y-address signals YWR1 to YWRm in the L-level state (FIG. 9).

/Time t2 Through t3/

Similar to the above, according to the write operation of the serial access memory 301 in the period of time t2 to t3, the write Y-address selector 14 selects in sequence the write Y-address signals YW2 to YWm and puts them in the H-level, but the write/read Y-address selector 30 keeps all the write/read Y-address signals YWR2 to YWRm in the L-level state. As the result of this, the input data DI1 to DIm are stored only in the write registers Wreg-1 to Wreg-m, not in the write/read registers WRreg-1 to WReg-m.

/Time t4/

The word line WL1 is put in the H-level by the X-address selector 13 and further, the control signal WT is put in the H-level by the memory control portion 12. As the result of this, the input data DI1 to DIm stored in the write register group 17 are transferred to the memory cells MC11 to MCm1 connected with the word line WL1 all at once.

/Time t4'/

The control signal WTD is put in the H-level by the memory control portion 12. With this, the input data DI1 to DIm stored in the write register group 17 are transferred to the write/read register group 32 all at once. At this time, the same data DI1 to DIm are stored in both of the memory cells MC11 to MCm1 connected with the word line WL1 and the write/read registers WRreg-1 to WRreg-m.

/Time t5 and Thereafter/

The write operation of the serial access memory 301 at time t5 and thereafter is identical to that of the serial access memory 101.

The above is an example of the write operation of the serial access memory 301 as set in the second operational mode.

The read operation of the serial access memory 301 is executed in the almost same way as that of the serial access memory 101 of the first embodiment as shown in FIGS. 4 and 5.

As described above, according to the serial access memory 301, in the same way as the serial access memory 101 of the first embodiment, it becomes possible to selectively execute either the write/read operation equivalent to the write/read operation of the prior art line access type serial access memory or the write/read operation equivalent to the write/read operation of the prior art FIFO type serial access memory.

Furthermore, according to the serial access memory 301, since it is not necessary for the write/read Y-address selector 30 to select the write/read Y-address signals YWR1 to YWRm in the write operation, the electric power reduction can be realized.

In the write operation of the serial access memory 301, it may be allowed to store the input data DI1 to DIm relating to the leading line address only in the write/read registers WRreg-1 to WRreg-m, instead of transferring the input data DI1 to DIm from the write registers Wreg-1 to Wreg-m to the memory cells MC11 to MCm1 connected with the word line WL1 and storing them there. To put it concretely, let the control signal WT as put in the H-level at time t6 of FIG. 8 and at time t4 of FIG. 9, be held in the L-level. With this, since the write side first transfer units 16-1 to 16-m are kept in the OFF state, the data stored in the write registers Wreg-1 to Wreg-m is not be transferred to the memory cell array 11. Subsequently, by putting the control signal WTD in the H-level, the data stored in the write registers Wreg-1 to Wreg-m are transferred to the write/read registers WRreg-1 to WRreg-m. As the result of this, the input data DI1 to Dim relating to the leading line address are stored only in the write/read registers WRreg-1 to WRreg-m. In the read operation following the write operation, the data is read out from the write/read registers WRreg-1 to WRreg-m without accessing to the memory cells MC11 to MCm1.

As described above, since the input data DI1 to DIm relating to the leading line address is stored only in the write/read registers WRreg-1 to WRreg-m, The time required for transferring the data is reduced and the electric power reduction can be realized.

Fourth Embodiment

Figure 10:
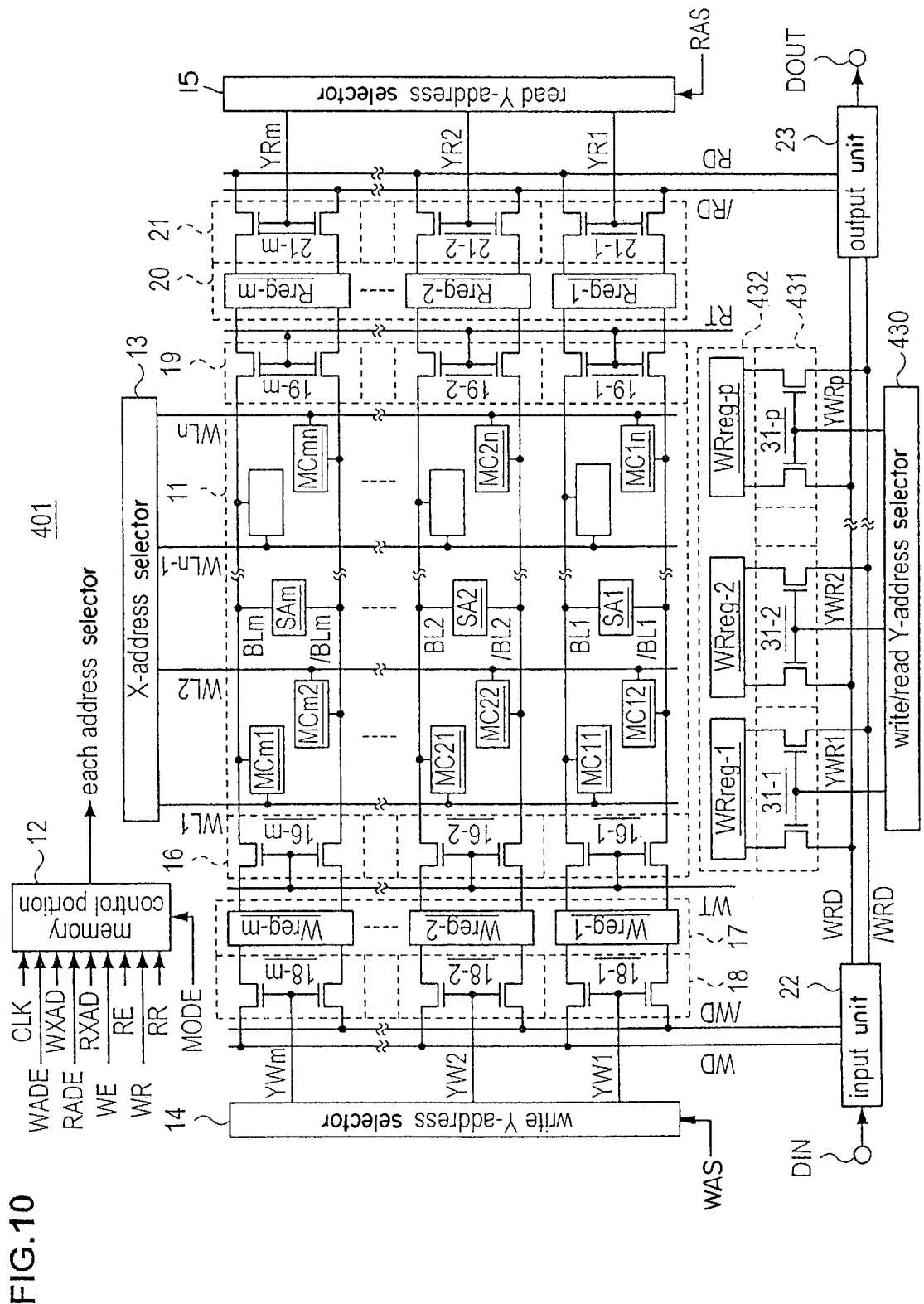
FIG. 10 is a circuit diagram for showing the structure of a serial access memory according to the fourth embodiment of the invention.

FIG. 10 is a diagrammatic view showing the structure of a serial access memory 401 according to the fourth embodiment of the invention.

This serial access memory 401 has such a structure that is obtained by substituting a write/read Y-address selector 430, a write/read transfer unit group 431, and a write/read register group 432 for the write/read Y-address selector 30, the write/read transfer unit group 31, and the write/read register group 32 of the serial access memory 101 (the first embodiment). That is, the serial access memory 401 is provided with a memory cell array 11, a memory control portion 12, an X-address selector 13, a write Y-address selector 14, a read Y-address selector 15, a write side first transfer unit group 16, a write register group 17, a write side second transfer unit group 18, a read side first transfer unit group 19, a read register group 20, a read side second transfer unit group 21, an input unit 22, an output unit 23, a write/read Y-address selector 430, a write/read transfer unit group 431, and a write/read register group 432.

The write/read register group 432 is made up of the write/read registers WRreg-1 to WRreg-p.

These write/read registers WRreg-1 to WRreg-p have a structure identical to each other. The number of these registers (p pieces) is less than the number of the memory cells (m pieces) connected with each of the word lines WL1 to WLn.

The write/read register group 432 is connected with the input unit 22 and the output unit 23 through the write/read data buses WRD, /WRD. The write/read transfer unit group 431 is made up of the write/read transfer units 31-1 to 31-p respectively corresponding to the write/read registers WRreg-1 to WRreg-p which form the write/read register group 432.

Each of the write/read transfer units 31-1 to 31-p is made up of two transistors. For instance, the write/read register WRreg-1 is connected with the write/read data buses WRD, /WRD through drains and sources of two transistors which form the write/read transfer unit 31-1. The write/read Y-address signals YWR1 to YWRp outputted from the write/read Y-address selector 430 are correspondingly inputted to the write/read transfer units 31-1 to 31-p, and the ON/OFF control of two transistors forming each of the write/read transfer units 31-1 to 31-p is carried out with the write/read Y-address signals YWR1 to YWRp.

The operation of the serial access memory 401 formed as above will be described with reference to FIGS. 11 through 14. In starting the write/read operation of the serial access memory 401, a mode signal MODE is inputted to the memory control portion 12, thereby an operational mode being set.

Figure 11:
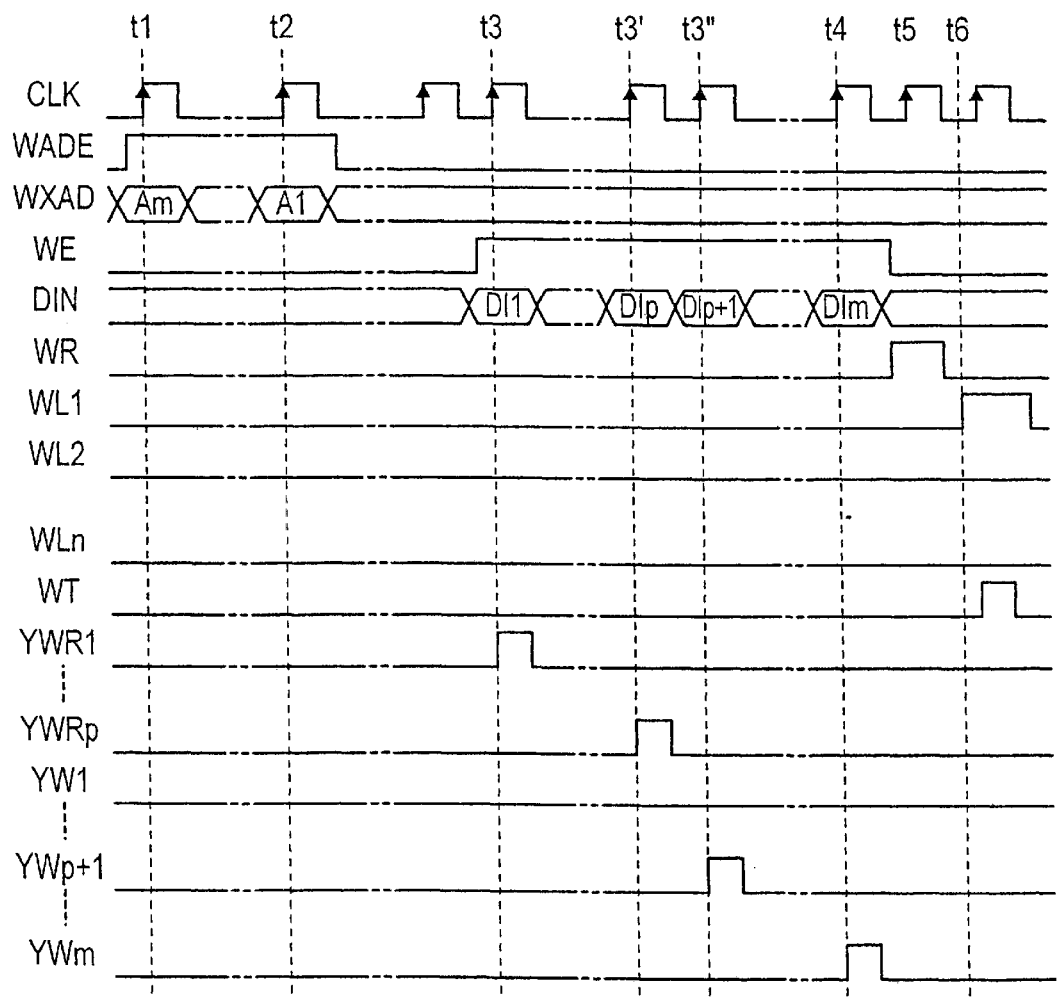
FIG. 11 is a timing chart for describing the write operation (in the first operational mode) of the serial access memory illustrated in FIG. 10.

FIG. 11 is a timing chart for describing the write operation of the serial access memory 401 as set in the first operational mode. The write operation will be described with the passage of time as shown in the figure.

/Time t1/

A write X-address WXAD is inputted to the memory control portion 12. At this stage, however, a write address enable signal WADE of the H-level is inputted in advance to the memory control portion 12 in order to enable the memory control portion 12 to take in the write X-address WXAD. To begin with, at time t1, the most significant bit (MSB) data Am of the write X-address WXAD is taken in the memory control portion 12. Thereafter, each bit data of the write X-address WXAD is taken in sequence in the memory control portion 12 in synchronism with a clock signal CLK.

/Time t2/

Then, the least significant bit (LSB) data A1 of the write X-address WXAD is taken in the memory control portion 12, thereby the take-in operation of the write X-address WXAD being completed. At this stage, the write address enable signal WADE to be inputted to the memory control portion 12 is put in the L-level. The write operation will now be described assuming that the word line WL1 is first selected with the write X-address WXAD.

/Time t3/

At time t3 after a predetermined period of time (wait time: about 1.5 $\mu$s) has passed away from time t2, the memory control portion 12 detects the write enable signal WE of the H-level in the rise timing of the clock signal CLK. With this, the substantial write operation is commenced. The write/read Y-address selector 430 selects the write/read Y-address signal YWR1 from the write/read Y-address signals YWR1 to YWRp and puts it in the H-level. At this time, the input data DI1 inputted from the input terminal DIN is transmitted to the write data buses WD, /WD and the write/read data buses WRD, /WRD as well through the input unit 22. Since the write/read transfer unit 31-1 is put in the ON state with the write/read Y-address signal YWR1 of the H-level, the input data DI1 is stored in the write/read register WRreg-1.

/Time t3 Through t3'/

Up to time t3' from time t3, the write/read Y-address selector 430 selects in sequence the write/read Y-address signals YWR2 to YWRp from the write/read Y-address signals YWR1 to YWRp in synchronism with the clock signal CLK and puts each of them in the H-level. On one hand, the input data DI2 to DIp are inputted in sequence to the input terminal DIN, and each of the input data DI2 to DIp is stored in each of the write/read registers WRreg-2 to WRreg-p through the input unit 22 and the write/read data buses WRD, /WRD.

/Time t3"/

At the time the input data DIp has been stored in the write/read register WRreg-p, the memory control portion 12 outputs a write address set signal WAS. The write Y-address selector 14 is arranged so as to be able to set the address by a pointer, and outputs a write Y-address signal YWp+1 of the H-level as a start address of the write register group 17 based on the write address set signal WAS outputted from the memory control portion 12. At this time, the input data DIp+1 inputted from the input terminal DIN is transmitted to the write data buses WD, /WD through the input unit 22. Since the write side second transfer unit 18-p+1 is put in the ON state with the write Y-address signal YWp+1, the input data DIp+1 is stored in the write register Wreg-p+1.

/Time t3" Through t4/

Up to time 4 after time t3", the write Y-address selector 14 selects in sequence the write Y-address signals YWp+1 to YWm from the write Y-address signals YW1 to YWm in synchronism with the clock signal CLK and puts them in the H-level. On one hand, the input data DIp+1 to DIm are inputted in sequence to the input terminal DIN, and each of the input data DIp+1 to DIm is stored in each of the write registers Wreg-p+1 to Wreg-m through the input unit 22 and the write data buses WD, /WD.

/Time t5 and Thereafter/

The write operation of the serial access memory 401 at time t5 and thereafter is almost identical to that of the serial access memory 101 according to the first embodiment.

The above is an example of the write operation of the serial access memory 401 as set in the first operation mode.

In the next, the write operation of the serial access memory 401 as set in the second operational mode will be described with reference to FIG. 12.

/Time t1/

The write operation starts when the write reset signal WR is inputted to the memory control portion 12. The memory control portion 12 detects the write reset signal WR of the H-level in the rise timing of the clock signal CLK.

/Time t2/

The write/read Y-address selector 430 selects the write/read Y-address signal YWR1 from write/read Y-address signals YWR1 to YWRp and puts it in the H-level. At this time, the input data DI1 inputted from the input terminal DIN is transmitted to the write/read data buses WRD, /WRD through the input unit 22. Since the write/read transfer unit 31-1 is put in the ON state with the write/read Y-address signal YWR1 of the H-level, the input data DI1 is stored in the write/read register WRreg-1.

/Time t2 to t2'/

Up to time t2' after time t2, the write/read Y-address selector 430 selects in sequence the write/read Y-address signals YWR2 to YWRp from the write/read Y-address signals YWR1 to YWRm in synchronism with the clock signal CLK and puts them in the H-level. On one hand, the input data DI2 to DIp are inputted in sequence to the input terminal DIN, and each of the input data DI2 to DIp is stored in each of the write/read registers WRreg-2 to WRreg-p through the input unit 22 and the write/read data buses WRD, /WRD.

/Time t2"/

At the time the input data DIp has been stored in the write/read register WRreg-p, the memory control portion 12 outputs a write address set signal WAS. The write Y-address selector 14 is arranged so as to be able to set the address by a pointer, and outputs a write Y-address signal YWp+1 of the H-level as a start address of the write register group 17 based on the write address set signal WAS outputted from the memory control portion 12. At this time, the input data DIp+1 inputted from the input terminal DIN is transmitted to the write data buses WD, /WD through the input unit 22. Since the write side second transfer unit 18-p+1 is put in the ON state with the write Y-address signal YWp+1, the input data DIp+1 is stored in the write register Wreg-p+1.

/Time t2" Through t3/

Up to time t3 after time t2", the write Y-address selector 14 selects in sequence the write Y-address signals YWp+1 to YWm from the write Y-address signals YW1 to YWm in synchronism with the clock signal CLK and puts them in the H-level. On one hand, the input data DIp+1 to DIm are inputted in sequence to the input terminal DIN, and each of the input data DIp+1 to DIm is stored in each of the write registers Wreg-p+1 to Wreg-m through the input unit 22 and the write data buses WD, /WD.

/Time t4 and Thereafter/

The write operation of the serial access memory 401 at time t4 and thereafter is almost identical to that of the serial access memory 101 according to the first embodiment.

The above is an example of the write operation of the serial access memory 401 as set in the second operation mode.

Figure 13:
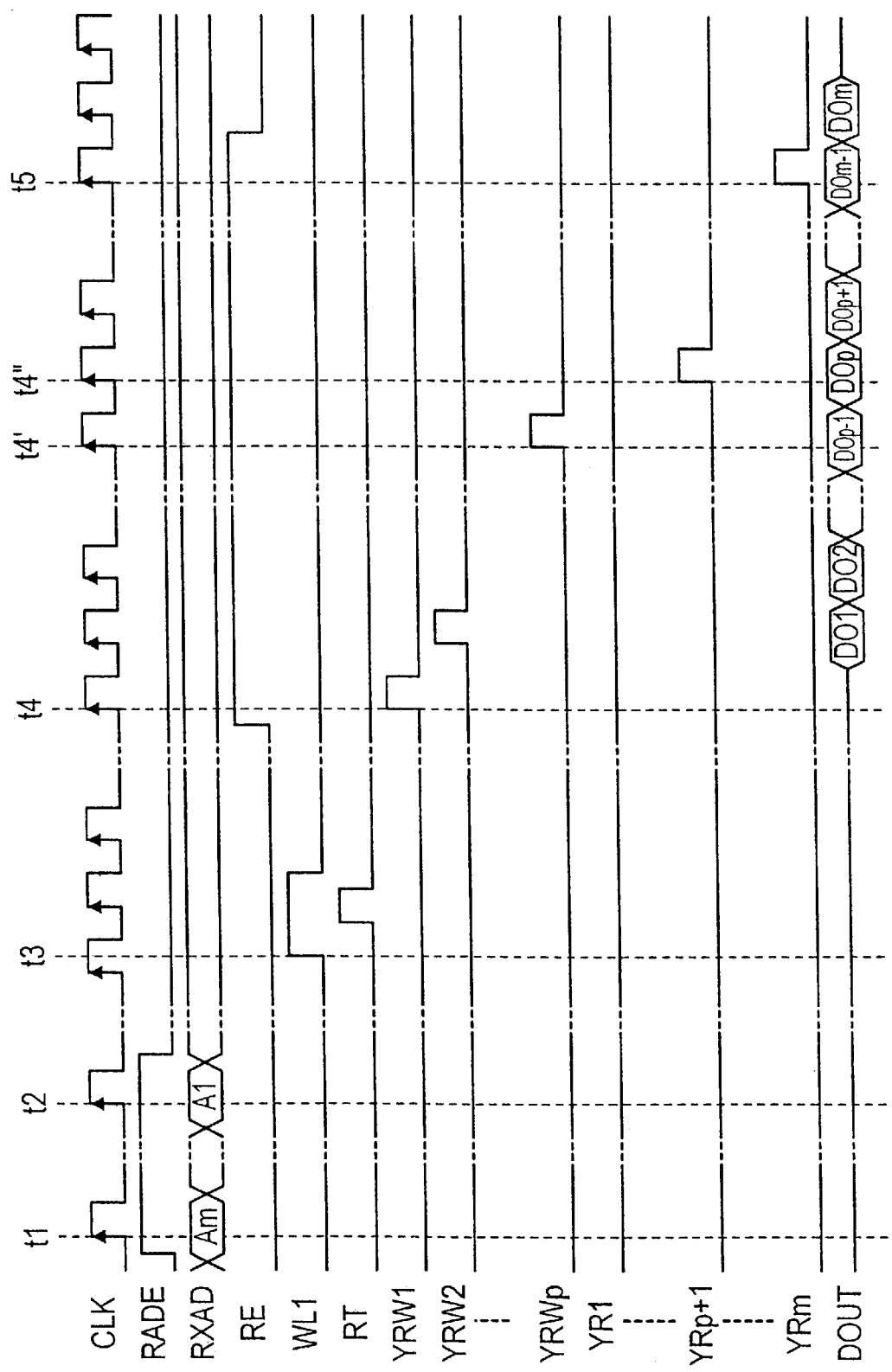
FIG. 13 is a timing chart for describing the read operation (in the first operationa[008c] mode) of the serial access memory illustrated in FIG. 10.

In the next, the read operation of the serial access memory 401 as set in the first operational mode will be described with reference to FIG. 13.

/Time t1/

A read X-address RXAD is inputted to the memory control portion 12. At this stage, however, a read address enable signal RADE of the H-level is inputted in advance to the memory control portion 12 in order to enable the memory control portion 12 to take in the read X-address RXAD. To begin with, at time t1, the most significant bit (MSB) data Am of the read X-address RXAD is taken in the memory control portion 12. Thereafter, each bit data of the read X-address RXAD is taken in sequence in the memory control portion 12 in synchronism with a clock signal CLK.

/Time t2/

Then, the least significant bit (LSB) data A1 of the read X-address RXAD is taken in the memory control portion 12, thereby the take-in operation of the read X-address RXAD being completed. At this stage, the read address enable signal RADE to be inputted to the memory control portion 12 is put in the Llevel. The read operation will now be described assuming that the word line WL1 is selected with the read X-address RXAD.

/Time t3/

The word line WL1 selected at time t2 is put in the H-level by the X-address selector 13 and further, the control signal RT is put in the H-level by the memory control portion 12. As the result of this, each data stored in the memory cells MC11 to MCm1 connected with the word line WL1 is transferred to the read registers Rreg-1 to Rreg-m through the read side first transfer group 19 all at once.

/Time t4/

The memory control portion 12 detects the read enable signal RE of the H-level in the rise timing of the clock signal CLK. The write/read Y-address selector 430 selects a write/read Y-address signal YWR1 from the write/read Y-address signals YWR1 to YWRp and puts it in the H-level. Since the write/read transfer unit 31-1 is put in the ON state with the write/read Y-address signal YWR1 of the H-level, the data stored in the write/read register WRreg-1 is transmitted to the write/read data buses WRD, /WRD. The data transmitted to the write/read data buses WRD, /WRD is outputted to the output terminal DOUT through the output unit 23 as the output data DO1.

/Time t4 to t4'/

Up to time t4' after time t4, the write/read Y-address selector 430 selects in sequence the write/read Y-address signals YWR2 to YWRp from the write/read Y-address signals YWR1 to YWRp in synchronism with the clock signal CLK and puts each of them in the H-level. As this goes on, each data stored in the write/read registers WRreg-2 to WRreg-p is transmitted in sequence to the write/read data buses WRD, /WRD. Each data sequentially transmitted to the write/read data buses WRD, /WRD is outputted to the output terminal DOUT through the output unit 23 as the output data DO2 to DOp.

/Time t4"/

At the time the storage data of the write/read register WRreg-p has been outputted to the write/read data buses WRD, /WRD, the memory control portion 12 outputs a read address set signal RAS. The read Y-address selector 15 is arranged so as to be able to set the address by a pointer, and outputs a read Y-address signal YRp+1 of the H-level as a start address of the read register group 20 based on the read address set signal RAS outputted from the memory control portion 12. Since the read side second transfer unit 21 -p+1 is put in the ON state with the read Y-address signal YRp+1 of the H-level, the data stored in the read register Rreg-p+1 is transmitted to the read data buses RD, /RD. The data transmitted to the read data buses RD, /RD is outputted to the output terminal DOUT as an output data DOp+1 through the output unit 23.

/Time t4" to t5/

Up to time t5 after time t4", the read Y-address selector 15 selects in sequence the read Y-address signals YRp+1 to YRm from the read Y-address signals YR1 to YRm in synchronism with the clock signal CLK and puts each of them in the H-level. As this goes on, each data stored in the read registers Rreg-p+1 to Rreg-m is transmitted in sequence to the read data buses RD, /RD. Each data sequentially transmitted to the read data buses RD, /RD is outputted to the output terminal DOUT as the output data DOp+1 to DOm through the output unit 23.

The above is an example of the read operation of the serial access memory 401 as set in the first operational mode.

Figure 14:
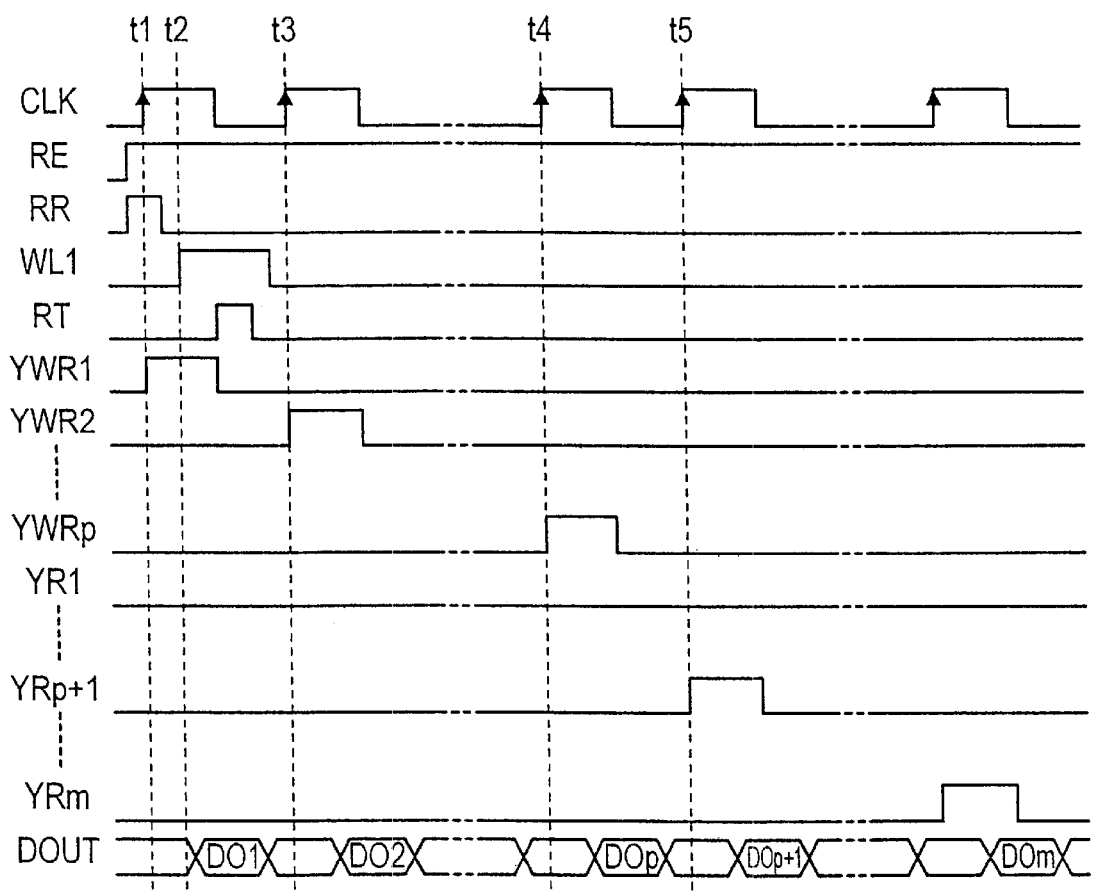
FIG. 14 is a timing chart for describing the read operation (in the second operational mode) of the serial access memory illustrated in FIG. 10.

In the next, the read operation of the serial access memory 401 as set in the second mode will be described with reference to FIG. 14.

/Time t1/

The read operation starts when the read reset signal RR is inputted to the memory control portion 12. The memory control portion 12 detects the read reset signal RR of the H-level in the rise timing of the clock signal CLK. The write/read Y-address selector 430 selects the write/read Y-address signal YWR1 from the write/read Y-address signals YWR1 to YWRp and puts it in the H-level. Since the write/read transfer unit 31-1 is put in the ON state with the write/read Y-address signal YWR1 of the H-level, the data stored in the write/read register WRreg-1 is outputted to the output terminal DOUT as an output data DO1 through the write/read data buses WRD, /WRD and the output unit 23. In this read operation, the first output data DO1 is outputted after the input of the read reset signal RR without waiting for the passage of the wait time.

/Time t2/

The word line WL1 is put in the H-level by the X-address selector 13 and further, the control signal RT is put in the H-level by the memory control portion 12. As the result of this, each data stored in the memory cells MC11 to MCm1 connected with the word line WL1 is transferred to the read register Rreg-1 to Rreg-m through the read side first transfer unit group 19 all at once. In the manner like this, if the storage data of the memory cells MC11 to MCm1 connected with the word line WL1 are transferred to the read registers Rreg-1 to Rreg-m in parallel with the read operation of the data from the write/read registers WRreg-1 to WRreg-m, it becomes possible to start the read operation of the data from the read registers Rreg-1 to Rreg-m immediately after completing the read operation of the data from the write/read registers WRreg-1 to WRreg-p.

/Time t3/

The write/read Y-address selector 430 selects the write/read Y-address signal YWR2 from the write/read Y-address signals YWR1 to YWRp in synchronism with the clock signal CLK and puts it in the H-level. Since the write/read transfer unit 31-2 is put in the ON state with the write/read Y-address signal YWR2 of the H-level, the data stored in the write/read register WRreg-2 is outputted to the output terminal DOUT as an output data DO2 through the write/read data buses WRD, /WRD, and the output unit 23.

/Time t3 to t4/

Up to time t4 after time t3, the write/read Y-address selector 430 selects the write/read Y-address signals YWR2 to YWRp from the write/read Y-address signals YWR1 to YWRp in synchronism with the clock signal CLK and puts each of them in the H-level. As this goes on, each data stored in the write/read registers WRreg-2 to WRreg-p is outputted in sequence to the output terminal DOUT as the output data DO2 to DOp through the write/read data buses WRD, /WRD and the output unit 23.

/Time t5/

At the time the storage data of the write/read register WRreg-p has been outputted to the write/read data buses WRD, /WRD, the memory control portion 12 outputs a read address set signal RAS. The read Y-address selector 15 is arranged so as to be able to set the address by a pointer, and outputs a read Y-address signal YRp+1 of the H-level as a start address of the read register group 20 based on the read address set signal RAS outputted from the memory control portion 12. Since the read side second transfer unit 21-p+1 is put in the ON state with the read Y-address signal YRp+1 of the H-level, the data stored in the read register Rreg-p+1 is transmitted to the output unit 23 through the read data buses RD, /RD, and is then outputted to the output terminal DOUT as an output data DOp+1.

/Time t5 and Thereafter/

The read Y-address selector 15 selects in sequence the read Y-address signal YRp+1 to YRm from the read Y-address signals YR1 to YRm in synchronism with the clock signal CLK and puts each of them in the H-level. As this goes on, each data stored in the read registers Rreg-p+1 to Rreg-m is transmitted in sequence to the output unit 23 through the read data buses RD, /RD and outputted to the output terminal DOUT as the output data DOp+1 to DOm.

The above is an example of the read operation of the serial access memory 401 as set in the second operational mode.

As described above, according to the serial access memory 401 and the write/read operation thereof, in the same way as the serial access memories 101, 201, and 301 according to the first, second, and third embodiments, it becomes possible to suitably select and execute either the write/read operation of the prior art serial access memory of the line access type or the same of the prior art serial access memory of the FIFO type.

Furthermore, according to the serial access memory 401, since the number (P) of the write/read registers WRreg-1 to WRreg-p is made less than the number (m) of the memory cells connected with each of word lines WL1 to WLn, the area of the electronic circuit layout can be made smaller. As to the value of p, it is preferable to set it taking account of the waiting time as describe previously and the data write/read time of the write/read registers WRreg-1 to WRreg-m as well.

Figure 12:
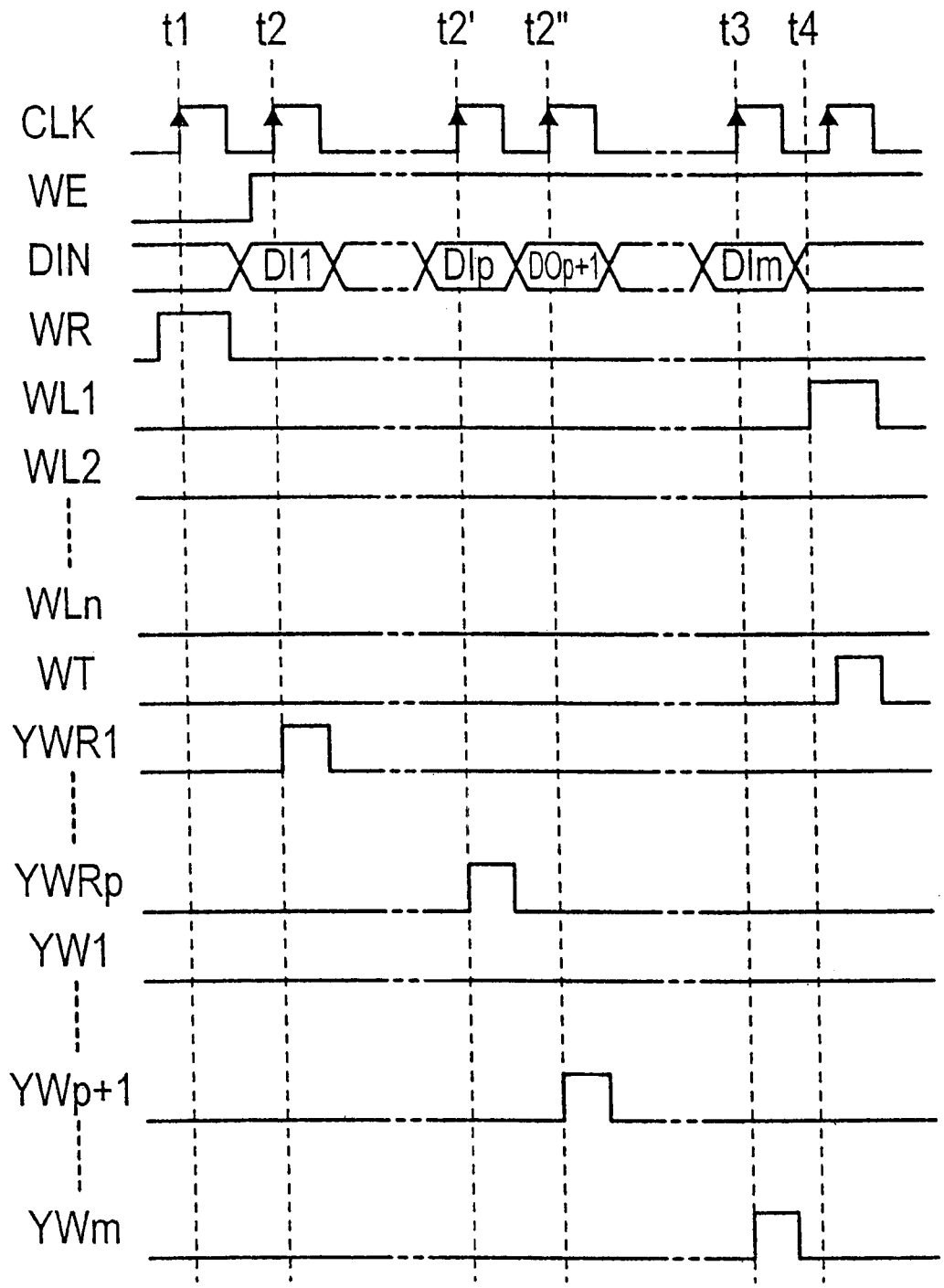
FIG. 12 is a timing chart for describing the write operation (in the second operational mode) of the serial access memory illustrated in FIG. 10.

In the serial access memory 401 as shown in FIGS. 11 and 12, the input data DI1 to DIp relating to the leading line address among the input data DI1 to DIm is stored only in the write/read registers WRreg-1 to WRreg-p. However, this data may be stored also in the write registers Wreg-1 to Wreg-p at the same time. According to this method, there is no need for the write Y-address selector 14 to execute the address control of the write register group 17 based on the write address set signal WAS. In other words, the write operation control of the serial access memory 401 becomes much easier.

The invention has been described in detail with respect to several preferred embodiments of the invention with reference to the accompanying drawings related thereto. As a matter of course, however, the invention is not to be limited to those embodiments. It is apparent that any one who has an ordinary skill in the art may attempt various variations and modifications within the technical category recited in the scope of claim for patent attached hereto, and it is understood that those variations and modifications are naturally within the technical scope of the invention.

As has been discussed so far, according to the invention, it becomes possible to suitably select and execute either the write/read operation of the prior art serial access memory of the line access type or the write/read operation of the prior art serial access memory of the FIFO type.

What is claimed is:

1. A serial access memory comprising:
   plural memory cells which are arranged at each of intersections formed by plural word lines and plural bit lines;
   a first register having a capacity capable of storing a data of one word to be stored in said plural memory cells and being connected with each of said plural bit lines, said first register storing an input serial data of one word and transferring the one word stored in said first register to the plural memory cells connected with one word line selected from among said plural word lines;
   a second register having a capacity capable of storing a data of one word to be stored in said plural memory cells and being connected with each of said plural bit lines, said second register receiving the one word from said plural memory cells connected with the one word line and outputting the one word received by said second register as an output serial data of one word;
   a third register having a capacity capable of storing a data of one word to be stored in said plural memory cells, said third register storing the input serial data of the one word and outputting the one word stored in said third register as another output serial data of one word; and
   a common address selector that provides address signals,
   the one word received by said second register and the one word stored in said third register being serially output according to the address signals provided from said common selector.

2. A serial access memory as claimed in claim 1, further comprising a data transfer block that transfers the one word stored in said first register to said third register.

3. A serial access memory:
   plural memory cells which are arranged at each of intersections formed by plural word lines and plural bit lines;
   a first register having a capacity capable of storing a data of one word to be stored in said plural memory cells and being connected with each of said plural bit lines, said first register storing an input serial data of one word and transferring the one word stored in said first register to the plural memory cells connected with one word line selected from among said plural word lines;
   a second register having a capacity capable of storing a data of one word to be stored in said plural memory cells and being connected with each of said plural bit lines, said second register receiving the one word from said plural memory cells connected with the one word line and outputting the one word received by said second register as an output serial data of one word;
   a third register having a capacity capable of storing a data of one word to be stored in said plural memory cells, said third register storing the input serial data of the one word and outputting the one word stored in said third register as another output serial data of one word; and
   a data transfer block that transfers the one word stored in said first register to said third register.

4. A data write/read method applicable to a serial access memory which includes
   plural memory cells which are arranged at each of intersections made by plural word lines and plural bit lines,
   a first register, having a capacity capable of storing a data of one word to be stored in said plural memory cells, connected with each of said plural bit lines,
   a second register, having a capacity capable of storing a data of one word to be stored in said plural memory cells, connected with each of said plural bit lines, and
   a third register, having a capacity capable of storing a data of one word to be stored in said plural memory cells,
   said data write/read method comprising:
   storing an input serial data of one word in said first register and said third register;
   transferring the one word stored in said first register to the plural memory cells connected with one word line selected from among said plural word lines;
   storing in the first register an input serial data of another word sequential to the input serial data of the one word stored in said first register and said third register; and
   transferring the another word stored in said first register to the plural memory cells connected with another word line selected from among said plural word lines.

5. A data write/read method as claimed in claim 4, further comprising:
   transferring the one word from the plural memory cells connected with the one word line to said second register;
   outputting the one word transferred to and stored in said second register as an output serial data of one word;
   transferring the another word from the plural memory cells connected with the another word line to said second register; and
   outputting the another word transferred to and stored in said second register as another output serial data of one word.

6. A data write/read method as claimed in claim 4, further comprising:
   outputting the one word stored in said third register as an output serial data of one word;
   transferring the another word to said second register from the plural memory cells connected with the another word line; and
   outputting the another word transferred to and stored in said second register as another output serial data of one word.

7. A data write/read method as claimed in claim 6, wherein said outputting the one word is executed in parallel with said outputting the another word.

8. A data write/read method applicable to a serial access memory which includes
   plural memory cells which are arranged at each of intersections made by plural word lines and plural bit lines,
   a first register, having a capacity capable of storing a data of one word to be stored in said plural memory cells, connected with each of said plural bit lines,
   a second register, having a capacity capable of storing a data of one word to be stored in said plural memory cells, connected with each of said plural bit lines, and
   a third register, having a capacity capable of storing a data of one word to be stored in said plural memory cells,
   said data write/read method comprising:
   storing an input serial data of one word in said first register;
   transferring the one word stored in said first register to the plural memory cells connected with one word line selected from among said plural word lines and to said third register;

storing in the first register an input serial data of another word sequential to the input serial data of the one word stored in said first register; and transferring the another word stored in said first register to the plural memory cells connected with another word line selected from among said plural word lines.

9. A data write/read method as claimed in claim 8, further comprising:

transferring the one word from the plural memory cells connected with the one word line to said second register;

outputting the one word transferred to and stored in said second register as an output serial data of one word;

transferring the another word from the plural memory cells connected with the another word line to said second register; and outputting the another word transferred to and stored in said second register as another output serial data of one word.

10. A data write/read method as claimed in claim 8, further comprising:

outputting the one word stored in said third register as an output serial data of one word;

transferring the another word from the plural memory cells connected with the another word line to said second register; and outputting the another word transferred to and stored in said second register as another output serial data of one word.

11. A data write/read method as claimed in claim 10, wherein said outputting the one word is executed in parallel with said transferring the another word from the plural memory cells.

12. A data write/read method applicable to a serial access memory which includes plural memory cells which are arranged at each of intersections made by plural word lines and plural bit lines, a first register, having a capacity capable of storing a data of one word to be stored in said plural memory cells, connected with each of said plural bit lines, a second register, having a capacity capable of storing a data of one word to be stored in said plural memory cells, connected with each of said plural bit lines, and a third register, having a capacity capable of storing a data of one word to be stored in said plural memory cells, said data write/read method comprising:

storing an input serial data of one word in said first register;

transferring the one word stored in said first register to said third register;

storing in the first register an input serial data of another word sequential to the input serial data of the one word stored in said first register;

transferring the another word stored in said first register to the plural memory cells connected with one word line selected from among said plural word lines;

storing in the first register an input serial data of an additional word sequential to the input serial data of the another word stored in said first register; and transferring the additional word stored in said first register to the plural memory cells connected with another word line selected from among said plural word lines.

13. A data write/read method as claimed in claim 12, further comprising:

outputting the one word stored in said third register as an output serial data of one word;

transferring the another word from the plural memory cells connected with the one word line to said second register;

outputting the another word transferred to and stored in said second register as another output serial data of one word;

transferring the additional word from the plural memory cells connected with the another word line to said second register; and outputting the additional word transferred to and stored in said second register as an additional output serial data of one word.

14. A data write/read method as claimed in claim 13, wherein said transferring the another word from the plural memory cells is executed in parallel with said outputting the one word.

15. A data write/read method applicable to a serial access memory which includes plural memory cells which are arranged at each of intersections made by plural word lines and plural bit lines, a first register, having a capacity capable of storing a data of one word of m bits to be stored in said plural memory cells, connected with each of said plural bit lines, a second register, having a capacity capable of storing a data of one word of m bits to be stored in said plural memory cells, connected with each of said plural bit lines, and a third register, having a capacity of p bits capable of storing a data of one word to be stored in said plural memory cells, wherein p is less the m, said data write/read method comprising:

storing a first bit through a pth bit of an input serial data of one word in said third register;

storing a (p+1)th bit through an mth bit of said input serial data of the one word in said first register;

transferring the (p+1)th bit through the mth bit of the one word stored in said first register to the plural memory cells connected with one word line selected from among said plural word lines;

storing in the first register an input serial data of another word sequential to the input serial data of the one word stored in said third register and said first register; and transferring the another word stored in said first register to the plural memory cells connected with another word line selected from among said plural word lines.

16. A data write/read method as claimed in claim 15, further comprising:

transferring the (p+1)th bit through the mth bit of the one word from the plural memory cells connected with said one word line to said second register;

outputting the the first bit through the pth bit of the one word stored in said third register as an output serial data having a length of p bits;

outputting the (p+1)th bit through the mth bit of the one word transferred to and stored in said second register as another output serial data;

transferring the another word from the plural memory cells connected with the another word line to said second register; and outputting the another word transferred to and stored in said second register as an additional output serial data of one word.

17. A data write/read method as claimed in claim 15, further comprising:

outputting the first bit through the pth bit of the one word stored in said third register as an output serial data having a length of p bits;

transferring the (p+1)th bit through the mth bit of the one word of the plural memory cells connected with said one word line to said second register in parallel with outputting the first bit through the pth bit of the one word;

outputting the (p+1)th bit through the mth bit of the one word transferred to and stored in said second register as another output serial data;

transferring the another word from the plural memory cells connected with the another word line to said second register; and outputting the another word transferred to and stored in said second register as an additional output serial data of one word.

18. A serial access memory comprising:

a memory cell array having plural memory cells;

an input terminal;

an output terminal;

a write/read register;

an access controller coupled to said memory cell array, said input terminal, said output terminal and said write/read terminal, said access controller transfers a word of serial data input at said input terminal to said memory cell array for storage in a group of the plural memory cells and to said write/read register for storage therein, transfers another word of the serial data input at said input terminal to said memory cell array for storage in another group of the plural memory cells, transfers the word stored in said write/read register to said output terminal as an output serial data of one word, and transfers the another word from the another group of the plural memory cells to said output terminal as another output serial data of one word.

* * * * *